(12) United States Patent
Ouchi et al.

(10) Patent No.: US 8,137,113 B2
(45) Date of Patent: Mar. 20, 2012

(54) SOCKET, METHOD FOR MANUFACTURING SOCKET, AND SEMICONDUCTOR DEVICE

(75) Inventors: Yasuhiro Ouchi, Sakura (JP); Shinichi Nikaido, Sakura (JP); Haruo Miyazawa, Sakura (JP)

(73) Assignee: Fujikura Ltd., Tokyo (JP)

( * ) Notice: Subject to any disclaimer, the term of this patent is extended or adjusted under 35 U.S.C. 154(b) by 0 days.

(21) Appl. No.: 12/304,680

(22) PCT Filed: Jun. 7, 2007

(86) PCT No.: PCT/JP2007/061539
§ 371 (c)(1),
(2), (4) Date: Dec. 12, 2008

(87) PCT Pub. No.: WO2007/145128
PCT Pub. Date: Dec. 21, 2007

(65) Prior Publication Data
US 2009/0197437 A1    Aug. 6, 2009

(30) Foreign Application Priority Data

Jun. 12, 2006  (JP) .................................. 2006-162692
Apr. 13, 2007  (JP) .................................. 2007-105724

(51) Int. Cl.
*H01R 12/00* (2006.01)
(52) U.S. Cl. ......................................................... 439/66
(58) Field of Classification Search ................... 439/68, 439/66, 67, 91
See application file for complete search history.

(56) References Cited

U.S. PATENT DOCUMENTS

| | | | | |
|---|---|---|---|---|
| 4,548,451 A | * | 10/1985 | Benarr et al. | 439/85 |
| 4,714,326 A | * | 12/1987 | Usui et al. | 359/291 |
| 5,984,691 A | * | 11/1999 | Brodsky et al. | 439/66 |
| 6,450,821 B2 | * | 9/2002 | Otsuki et al. | 439/70 |
| 6,669,490 B1 | | 12/2003 | DelPrete et al. | |
| 6,976,888 B2 | | 12/2005 | Shirai et al. | |
| 7,083,429 B2 | | 8/2006 | Hashimoto et al. | |
| 2003/0092293 A1 | | 5/2003 | Ohtsuki et al. | |

FOREIGN PATENT DOCUMENTS

| | | |
|---|---|---|
| JP | 2000-243486 A | 9/2000 |
| JP | 2001-332321 A | 11/2001 |
| JP | 2003-077562 A | 3/2003 |
| JP | 2003-151709 A | 5/2003 |
| JP | 2004-95326 A | 3/2004 |
| JP | 2004-158430 A | 6/2004 |
| JP | 2005-19284 A | 1/2005 |
| JP | 2005-39241 A | 2/2005 |

OTHER PUBLICATIONS

Polyimide, English Wikipedia May 10, 2011.*
Coefficient of Thermal Expansion, English Wikipedia, Aug. 19, 2010.*
Office Action dated Sep. 6, 2011 from the Japanese Patent Office in counterpart Japanese application No. 2007-105724.

* cited by examiner

*Primary Examiner* — Tulsidas C Patel
*Assistant Examiner* — Phuongchi Nguyen
(74) *Attorney, Agent, or Firm* — Sughrue Mion, PLLC

(57) ABSTRACT

A socket includes an insulating elastomeric sheet having a penetration hole, metal circuits formed on at least one of the front and rear surfaces of the elastomeric sheet, and a through-hole having a metal film formed on an inner wall of the penetration hole. The metal circuit on the front surface of the elastomeric sheet is electrically connected to the metal circuit on the rear surface of the elastomeric sheet via the through-hole. With such a configuration of the socket, it is possible to provide a socket contact terminal and a semiconductor device having the same, which is suitable for low-resistance, large-current, and high-speed configurations.

20 Claims, 14 Drawing Sheets

SOCKET, METHOD FOR MANUFACTURING SOCKET, AND SEMICONDUCTOR DEVICE

TECHNICAL FIELD

1. Field of the Invention

The present invention relates to a socket used for mounting IC packages such as CPU or LSI onto a printed circuit board, more particularly, to a socket, a method for manufacturing the socket, and a semiconductor device having the socket which is suitably usable for mounting IC packages such as LGA packages or BGA packages on a printed circuit board.

The present invention contains subject matter related to Japanese Patent Application No. 2006-162692 filed at the Japanese Patent Office on Jun. 12, 2006, and 2007-105724 filed at the Japanese Patent Office on Apr. 13, 2007, the entire contents of which are incorporated herein by reference.

2. Background Art

In the related art, a technology has been used in which IC packages such as CPU or LSI are mounted onto a printed circuit board by means of a socket. In most of various semiconductor devices such as a motherboard of computers or servers, sockets are installed thereon in order to mount CPUs of LGA or BGA package types onto the motherboard.

With the recent trend toward high-speed, multi-pinned CPUs for improvement in the functionality and performance, the packages are manufactured so as to have a greater size and a fine pin pitch.

In line with this, the sockets need to be manufactured to cope with the trend toward the multi-pinned CPUs. Therefore, it is necessary to accommodate an increase in the bending of the packages with an increase in the size and an irregularity in the height of contact lands or balls in the packages. Accordingly, a structure is desirable in which a sufficient stroke of socket contacts is secured.

For the fine-pitched packages, it is important to realize a compact socket contact. Moreover, it is desirable that the IC pins are brought into contact with the socket contacts under a suitable contact pressure.

For the high-speed CPUs, it is important to realize a low-inductance contact. Moreover, it is desirable that the contact resistance is sufficiently low and the allowable current capacity is sufficiently high enough to cope with an increase in the current consumption accompanied by the high-speed operation.

Current LGA package socket mainly have 400 to 800 pins having a pitch of about 1 mm. Such a socket is manufactured by bending a metal plate in a complex manner to form a contact terminal having a predetermined shape and inserting the contact terminal into a socket housing. An example of such a conventional technology is disclosed in Patent Documents 1 and 2, for example.

Patent Document 1: Japanese Patent Application, Publication No. 2004-158430

Patent Document 2: Japanese Patent Application, Publication No. 2005-19264

Patent Document 3: U.S. Pat. No. 6,669,490

Patent Document 4: Japanese Patent Application, Publication No. 2001-332321

DISCLOSURE OF INVENTION

However, in the conventional technique disclosed in Patent Documents 1 and 2, the contact terminal is of a plate spring type, and thus, when the spring length is increased to increase the stroke of the contact terminal, the contact terminal may make contact with adjacent pins. Therefore, there is a problem that it is difficult to increase the stroke when the pins are made to have a finer pitch.

Moreover, in order to resolve such a problem, Patent Document 3 has proposed a technique that uses a structure using a column formed of a conductive elastomeric member in the contact terminal. In this case, since the repulsive properties of a socket are determined by the characteristics or the structure of the conductive elastomeric member, as long as it is possible to find a conductive elastomeric member exhibiting a suitable repulsive force, it is possible to realize a socket capable of securing a sufficient stroke under a desired load.

However, when the conductive elastomeric member as disclosed in Patent Document 3 is used, new following problems occur; (1) the contact is not a metal but an elastomeric member, the contact resistance is high compared with a metallic contact and there is a fear of an increasing possibility of heat generation or voltage drop in response to higher current consumption.

And (2) since the contact terminal does not wipe a metallic land when it is inserted to be fitted in a package, there occurs a new problem that it is difficult to remove an oxide film formed on a land.

Furthermore, Patent Document 4 has disclosed a electric connector which includes an insulating elastic sheet body such as a silicon rubber, wherein a number of conductive members laid underground so that the conductive member might penetrate in the direction of a thickness of an insulating elastic sheet body and both-ends sides of the conductive member might be exposed to a surface of the sheet body. A couple of protrusions projected from the same parts on the front and rear surfaces of the elastic sheet body, and a number of connecting electrodes are formed at lease over the tops of the protrusions on the front and rear surfaces. The connecting electrodes on the front and rear surfaces connect electrically between one another by a through-hole formed in the elastic sheet body. However, the connector which has disclosed by Patent Document 4 is, as shown in FIG. 3, has a structure wherein the connector is caught between the upper and lower base materials by denting protrusions 1a when a load is applied. Accordingly, it is impossible to achieve an effect such as removal of an oxide film by the wiping.

The present invention has been made in view of the above-described circumstances and an object of the present invention is to provide an excellent socket contact terminal capable of coping with low resistance, large current and fast operation speed requirements and a semiconductor device using the same.

To achieve the above-mentioned purpose, the present invention provides that a socket including an insulating elastomeric sheet formed from a fluorine-based elastomer having a penetration hole, metal circuits formed on at least one of the front and rear surfaces of the elastomeric sheet, and a through-hole having a metal film formed on an inner wall of the penetration hole, in which the metal circuit on the front surface of the elastomeric sheet is electrically connected to the metal circuit on the rear surface of the elastomeric sheet via the through-hole and a groove or the penetration hole is formed in at least a portion of a area by which the metal circuit on the elastomeric sheet is surrounded.

In the socket according to the present invention, a number of the terminals that includes the metal circuits and the through-halls may be formed and the grooves may be formed in a whole area except parts of the terminals.

In the socket according to the present invention, it is desirable that a convex portion is formed in at least a portion of the metal circuits on the front and rear surfaces of the elastomeric sheet.

In the socket according to the present invention, it is desirable that the convex portion has a stiffness such that itself is not distorted by pressing and distorting a portion of the elastomeric sheet contacting with the convex portion when a load is applied to the convex portion.

In the socket according to the present invention, a protective layer made of a material having a thermal expansion coefficient smaller than that of the elastomeric sheet is laminated on at least one of the front and rear surfaces of the elastomeric sheet.

In the socket according to the present invention, the protective layer is either or both of a polyimide sheet and a glass epoxy.

In the socket according to the present invention, the elastomeric sheet is made by laminating elastomeric layers on the front and rear surfaces of a sheet-like core member made of a material having a thermal expansion coefficient smaller than that of the elastomeric sheet.

In the socket according to the present invention, it is desirable that the penetration hole formed in the elastomeric sheet and the penetration hole formed in the core member are axially aligned, and the through-hole is formed by forming the metal film on the inner walls of the penetration holes.

In the socket according to the present invention, it is desirable that the core member is either or both of a polyimide sheet and a glass epoxy.

Furthermore, in the present invention, there is provided a method for manufacturing a socket, the method including: a step (1) of preparing an insulating elastomeric sheet having a penetration hole; and a step (2) of forming metal circuits on at least one of the front and rear surfaces of the elastomeric sheet and forming a through-hole by forming a metal film on an inner wall of the penetration hole, thereby obtaining a socket in which the metal circuit on the front surface of the elastomeric sheet is electrically connected to the metal circuit on the rear surface of the elastomeric sheet via the through-hole and the groove or the penetration hole is formed at least in a portion of a area by which the metal circuit on the elastomeric sheet is surrounded.

In the step (2), it is desirable that a metal foil serving as the metal circuit is attached onto a surface of the elastomeric sheet, and the through-hole is formed by electroplating the metal foil, thereby securing electrical connection between the front and rear surfaces.

In the method for manufacturing a socket according to the present invention, a number of the terminals that includes the metal circuits and the through-halls may be formed and the grooves may be formed in a whole area except parts of the terminals.

In the method for manufacturing a socket according to the present invention, it is desirable that a convex portion is formed in at least a portion of the metal circuits on the front and rear surfaces of the elastomeric sheet.

In the method for manufacturing a socket according to the present invention, it is desirable that the convex portion has a stiffness such that itself is not distorted by pressing and distorting a portion of the elastomeric sheet contacting with the convex portion when a load is applied to the convex portion.

In the method for manufacturing a socket according to the present invention, a protective layer made of a material having a thermal expansion coefficient smaller than that of the elastomeric sheet is laminated on at least one of the front and rear surfaces of the elastomeric sheet.

In the method for manufacturing a socket according to the present invention, the protective layer is either or both of a polyimide sheet and a glass epoxy.

In the method for manufacturing a socket according to the present invention, the elastomeric sheet is made by laminating elastomeric layers on the front and rear surfaces of a sheet-like core member made of a material having a thermal expansion coefficient smaller than that of the elastomeric sheet.

In the method for manufacturing a socket according to the present invention, it is desirable that the penetration hole formed in the elastomeric sheet and the penetration hole formed in the core member are axially aligned, and the through-hole is formed by forming the metal film on the inner walls of the penetration holes.

In the method for manufacturing a socket according to the present invention, the protective layer is either or both of a polyimide sheet and a glass epoxy.

According to a further aspect of the present invention, there is provided a semiconductor device including the socket according to the above-mentioned aspects of the present invention, and a printed circuit board and an IC package electrically connected to each other via the socket.

EFFECTS OF THE INVENTION

The socket of the present invention includes an insulating elastomeric sheet formed from a fluorine-based elastomer having a penetration hole, metal circuits formed on at least one of the front and rear surfaces of the elastomeric sheet, and a through-hole having a metal film formed on an inner wall of the penetration hole. The metal circuit on the front surface of the elastomeric sheet is electrically connected to the metal circuit on the rear surface of the elastomeric sheet via the through-hole. The groove or the penetration hole is formed at least in a portion of a area by which the metal circuit on the elastomeric sheet is surrounded. Accordingly, the socket can be manufactured with a small number of components and thus realizing a low-cost socket.

By decreasing the diameter of the through-hole, a narrow-pitched socket can be realized.

Since the contact portion is made of metal, the same metal as a connector terminal can be used in a plating process and thus realizing the connection at low contact resistance.

When a load is applied to the metal circuit, the metal circuit falls down onto the elastomeric sheet while being supported on the through-hole. A wiping function is realized by the movement of the metal circuit making a sliding contact with the contacting surface in opposite directions relative to each other. Therefore, an oxide film or a foreign material on the surface of the metal circuit can be removed. Accordingly, the connection can be established with the fresh metal surfaces and thus realizing a low-resistance electrical connection.

Since the upper and lower contact portions of the socket can be connected to each other by the application of a load, it is possible to design the socket so as to be replaceable and thus the socket can be suitably used as a server socket which requires a replaceable socket configuration for the purpose of maintenance.

Even when the printed circuit board is bent, the elastomeric sheet can follow the bending of the printed circuit board by elastically deforming itself. Accordingly, it is possible to reduce the effect of the bending of the printed circuit board.

By forming the elastomeric sheet from the fluorine-based elastomer, a heat-resistance property of the socket can be improved. Thus, a solder reflow process can be performed at the time of bonding the socket onto a substrate or a package.

Accordingly, it is possible to facilitate the bonding process and thus to decrease the manufacturing cost. In addition, since the fluorine-based elastomer has a behavior that a degree of hardness changes very little at low temperature, it is possible to provide a socket which is useful within a broad range of temperature.

Furthermore, the fluorine-based elastomer does not cause problems brought by outgassing. In the case of the elastomeric sheet formed from a silicon rubber, since it discharges siloxane, a poor contacting at a contact point are caused. However, in the case of the elastomeric sheet formed from the fluorine-based elastomer, since deterioration at the contact point does not be caused, it is possible to provide a socket maintaining a high reliability for long periods.

Moreover, the fluorine-based elastomer has a high chemical resistance and a high durability for processes of alkaline development, etching, and plating. Accordingly, by forming the elastomeric sheet from the fluorine-based elastomer, since an extra operation is not necessary protecting the elastomeric sheet, it is possible to facilitate the socket manufacturing process.

In the case of a structure arranging a number of terminals included a metal circuit and a through hole, when a load is applied, an elastomer at terminals is pressed and distorted. However, by forming a groove or a penetration hole at least on a part of an elastomer surrounding the metal circuit, a working force on a gap between the neighboring terminals is decreased, every terminal part is capable of being improved an independent activity. Accordingly, when a load is applied, connections of all terminal parts are capable of being assured.

Moreover, when a load is applied, since the elastomer is able to escape into the groove or the penetration hole, a driving is capable of being realized by a light load to the same displacement. Accordingly, a total amount of multi-pinned sockets is able to be lightened.

Furthermore, since a transfer of a tention of the elastomer and a force of compression the force generated on a gap between the neighboring terminals is decreased is decreased, In the case of a structure arranging a number of terminals included a metal circuit and a through hole, by controlling the size of the groove or the penetration hole, it is possible to control a load-displacement characteristic of the socket and manufacture easily a wide variety of sockets having different load-displacement characteristics. Accordingly, it is possible to meet the demand of a wide variety of sockets having different load-displacement characteristics By configuring the socket such that the convex portion is provided in at least a portion of the metal circuit on the front and rear surfaces of the elastomeric sheet, it is possible to realize a socket structure suitably usable for the printed circuit boards or the LGA packages having flat terminals while maintaining a predetermined load-displacement characteristic. Accordingly, the socket of the present invention can be applied to a wide range of fields. Incidentally, in the case of connecting the LGA package and the printed circuit board to each other by means of the socket of the present invention, it is possible to greatly decrease the number of steps required in the connecting operation.

Since the protective layer made of a material having a thermal expansion coefficient smaller than that of the elastomeric sheet is laminated on at least one of the front and rear surfaces of the elastomeric sheet, it is possible to suppress the expansion and contraction of the socket due to the heat generated in the IC package. Even in the case where there are a number of terminals formed by the metal circuit and the through-hole, it is possible to realize a secure connection of the entire terminals at the application time of the load.

Since the elastomeric sheet is made by laminating elastomeric layers on the front and rear surfaces of a sheet-like core member made of a material having a thermal expansion coefficient smaller than that of the elastomeric sheet, it is possible to suppress the expansion and contraction of the socket due to the heat generated in the IC package. Even in the case where there are a number of terminals formed by the metal circuit and the through-hole, it is possible to realize a secure connection of the entire terminals at the application time of the load.

Incidentally, according to the socket manufacturing method of the present invention, it is possible to manufacture the socket at a low cost in an efficient manner.

In the socket manufacturing method of the present invention, since the through-hole can be formed through an electroplating process using a metal foil serving as the metal circuit attached onto the elastomeric sheet as a base material, it is possible to manufacture the socket of the present invention in a more efficient manner.

Since the semiconductor device according to the present invention includes the socket of the present invention, and a printed circuit board and an IC package electrically connected to each other via the socket, it is possible to a highly efficient device suitable for low-resistance, large-current, and high-speed configurations.

Figure 1:
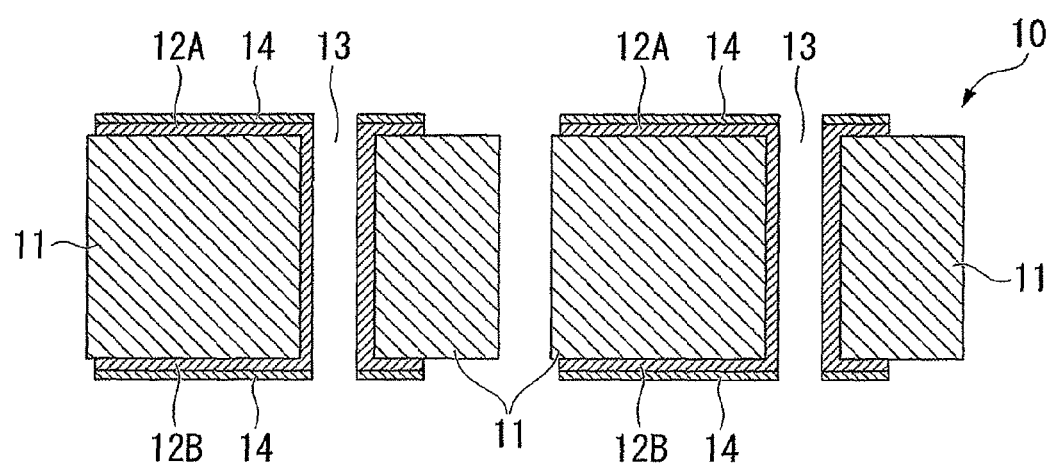
FIG. 1 is a side sectional diagram showing a socket in accordance with a first embodiment of the present invention.

DESCRIPTION OF SYMBOLS 10, 20, 30, 40, 50, 60, 80, 90: socket
11, 31, 41, 51, 61, 70, 81, 91: elastomeric sheet
12A, 12B, 32A, 32B, 42, 52, 62: metal circuit
13, 33, 43, 53, 63, 74: through-hole
14, 34, 45, 55, 65: gold plating
15, 22, 85, 96: semiconductor device
16, 23: printed circuit board
16A: circuit pattern
16B: solder paste
17: BGA package (IC package)
17A: solder ball
21, 35, 44, 54, 64: convex portion
23A: pattern wire
24: LGA package (IC package)
24A: LGA land
46, 56, 66: groove
57: protective layer
61A, 81A: core member
61B, 81B: elastomeric layer
71: copper foil (copper foil having an adhesive attached thereon)
72: penetration hole
73: metal film
82, 92: domical portion (convex portion)
83, 93: terminal
84, 94: through-hole plated portion
95: U-shaped slit (penetration hole)

BEST MODE FOR CARRYING OUT THE INVENTION

Hereinafter, embodiments of the present invention will be described with reference to the attached drawings.

First Embodiment

FIG. 1 is a side sectional diagram showing a socket in accordance with a first embodiment of the present invention. A socket 10 of the present embodiment includes an insulating elastomeric sheet 11 having a penetration hole, metal circuits 12A and 12B formed on each of front and rear surfaces of the elastomeric sheet 11, and a through-hole 13 having a metal film formed on an inner wall of the penetration hole. The metal circuit 12A on the front surface of the elastomeric sheet 11 is electrically connected to the metal circuit 12B on the rear surface of the elastomeric sheet 11 via the through-hole 13. A gold plating 14 is formed on each of the metal circuits 12A and 12B on the front and rear surfaces of the elastomeric sheet 11.

The socket 10 of the present embodiment has a socket structure in which a metal foil made of metal such as copper having an excellent conductivity is used as a contact terminal for connection of a printed circuit board and an IC package, and a repulsive force is secured by the elastomeric sheet 11. With such a structure, the socket can be designed to have a load-stroke characteristic based on the characteristic of the elastomer while realizing a metal contact. In the socket 10 of the present embodiment, since electric current flows into the formed metal circuits 12A and 12B, it is possible to realize a socket suitable for low-contact resistance, large-current, and high-speed configurations. Moreover, since a base member of the socket is integrally formed with the elastomer provided to secure a repulsive force, it is possible to manufacture the socket with a small number of components.

As a material for the elastomeric sheet 11, one capable of providing a suitable elastic repulsive force at the application time of the load to the metal circuits 12A and 12B can be suitably used. In particular, by forming the elastomeric sheet from the fluorine-based elastomer, a heat-resistance property of the socket can be improved. Thus, a solder reflow process can be performed at the time of bonding the socket onto a substrate or a package. Accordingly, it is possible to facilitate the bonding process and thus to decrease the manufacturing cost.

Furthermore, the fluorine-based elastomer does not cause problems brought by outgassing. In the case of the elastomeric sheet formed from a silicon rubber, since it discharges siloxane, a poor contacting at a contact point are caused.

However, in the case of the elastomeric sheet formed from the fluorine-based elastomer, since deterioration at the contact point does not be caused, it is possible to provide a socket maintaining a high reliability for long periods.

Moreover, the fluorine-based elastomer has a high chemical resistance and a high durability for processes of alkaline development, etching, and plating. Accordingly, by forming the elastomeric sheet from the fluorine-based elastomer, since an extra operation is not necessary protecting the elastomeric sheet, it is possible to facilitate the socket manufacturing process.

Next, a method for manufacturing the socket 10 of the present embodiment will be described.

First, an elastomeric sheet made of a fluorine-based elastomer or the like is prepared as a starting member.

Next, a penetration hole serving as a through-hole is perforated through the elastomeric sheet at a predetermined position using a drill or a laser. In this case, an elastomeric sheet having a preformed penetration hole may be used.

Subsequently, a metal film is formed on the front and rear surfaces of the elastomeric sheet and the penetration hole serving as the through-hole.

When forming the metal film, an electroless plating process or a deposition can be used. If it is hard to perform the plating onto the elastomeric sheet, a technique disclosed in JP-A-7-122850, for example, may be used to increase the adhesive property of the elastomeric sheet with the plate layer. In the technique disclosed in JP-A-7-122850, the elastomeric sheet is immersed in a metal sodium-naphthalene solution so as to energize the surface of the elastomeric sheet. Alternatively, the surface of the elastomeric sheet is made coarse by means of a sandblast or a plasma asher.

As a metal film for use in the above manufacturing stage, a metal such as copper or aluminum having an excellent conductivity is preferably usable. In this way, the metal film is formed on the front and rear surfaces of the elastomeric sheet and the penetration hole serving as the through-hole.

Incidentally, the electroless plating process or the deposition is known that it generally requires a relatively long time when forming a thick metal film. However, a thick metal film may be formed on the elastomeric sheet in a relatively short time even with the electroless plating process, in which a thin metal film is formed using the electroless plating process and then is grown to a thick metal film using an electroplating process.

Subsequently, an etching resist is coated on the front and rear surfaces of the elastomeric sheet in order to form a desired metal circuit. Examples of a method for coating the etching resist include a method for attaching a dry film thereon, a method for coating a liquid resist using a spin coating process, and a method for injecting a liquid resist in a fog-like shape using a spray coating process.

On the surface of the elastomeric sheet having the metal film coed with the resist, a pattern printing process is performed using a pattern mask corresponding to the shape of the desired circuit, and the uncured resist coated on the unnecessary portions is removed. In this way, the only resist coated on the desired circuit remains on the surface of the elastomeric sheet. In this state, a circuit forming process is performed using an aqueous solution such as iron chloride, copper chloride or ammonium hydroxide.

In the case where the lands of the IC package are plated with gold, additionally, a gold plating process may be performed to further decrease a contact resistance. At the time of the gold plating process, it is desirable to form a block layer as a ground having a nickel plate preformed thereon so that the gold plating does not diffuse into the copper.

Through the above-described processes, the socket 10 as shown in FIG. 1 is obtained.

With such a manufacturing method, it is possible to manufacture the socket 10 at a low cost in an efficient manner in which a repulsive force is generated by the elastomeric seat and the terminals are connected to each other through a metal contact.

Next, a contact operation of the socket 10 in a semiconductor device having the socket of the present embodiment will be described.

Figure 2A:
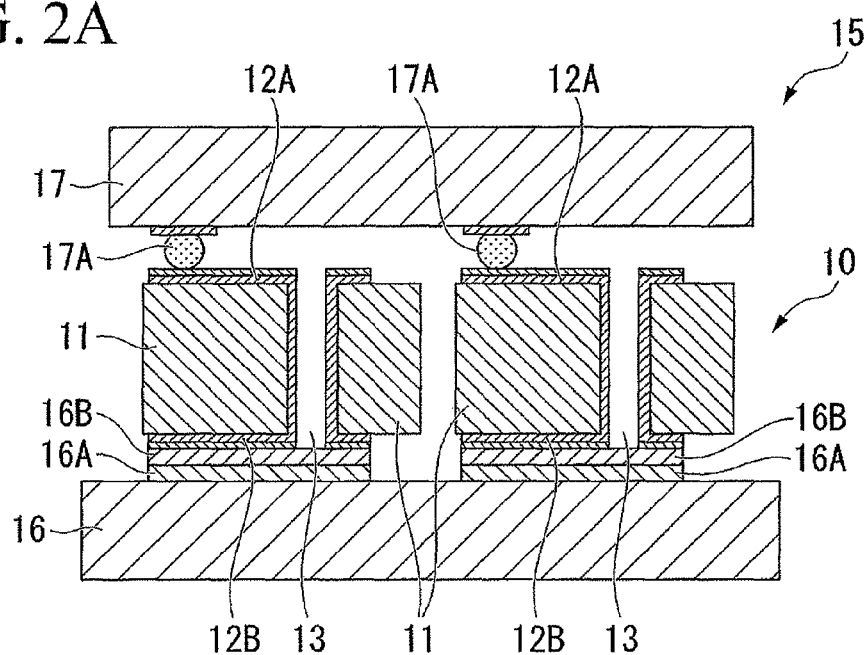
FIG. 2A is a side sectional diagram showing a contact operation of the socket, in which the socket is used as a socket for a BGA package type IC as an example of a semiconductor device having the socket of the first embodiment, and the diagram shows the state of the semiconductor device before the application of compressive force (or the released state after the application of compressive force)
Figure 2B:
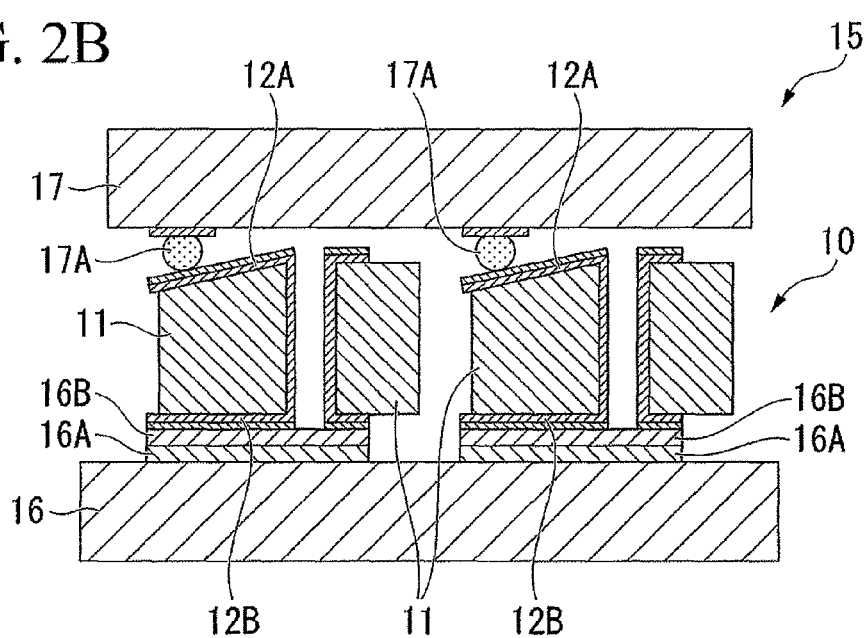
FIG. 2B is a side sectional diagram showing a contact operation of the socket, in which the socket is used as a socket for a BGA package type IC as an example of a semiconductor device having the socket of the first embodiment, and the diagram shows the state of the semiconductor device when compressive force is applied.

FIGS. 2A and 2B each shows a contact operation the socket 10, in which the socket is used as a socket for a BGA package type IC as an example of the semiconductor device having the socket 10 of the present embodiment. FIG. 2A is a side sectional diagram showing the state of the semiconductor device before the application of compressive force (or the released state after the application of compressive force). FIG. 2B is a side sectional diagram showing the state of the semiconductor device at the time of application of compressive force. In the drawing, reference numeral 15 represents a semiconductor device, 16 represents a printed circuit board, 16A represents a circuit pattern, 16B represents a solder paste, 17 represents a BGA package (IC package), and 17A represents a solder ball.

In the semiconductor device 15, when connecting the socket 10 into the circuit pattern 16A on the printed circuit board 16, the solder paste 16B is coated preliminarily on only needed portions of the printed circuit board 16, and the other metal circuit 12B of the socket 10 on the solder paste 16B, and a soldering process is performed thereon in a reflow furnace, thereby realizing an electrical connection therebetween. In this case, the elastomeric sheet 11 needs to have a sufficient heat-resistance enough to endure the reflow process atmosphere. For example, a fluorine-based elastomer capable of enduring the reflow process atmosphere is available commercially and preferably usable as the elastomeric sheet 11.

FIG. 2A shows the state in which IC of the BGA package 17 is placed on the printed circuit board 16 having the socket 10 installed thereon.

When a load is applied thereto, the elastomeric sheet 11 is compressed and falls down while generating a repulsive force. The mechanism of the load and the falling down of the elastomeric sheet at this moment corresponds to the load-displacement characteristic of the socket. In this case, since the metal circuit 12A falls down while being supported on the vicinity of the through-hole 13, the contact point moves toward the through-hole 13 with the application of the load. A wiping function is realized by the movement of the metal circuit 12A. Therefore, an oxide film on the each metal contact surface can be removed. Accordingly, the connection can be established with the fresh metal surfaces and thus realizing a low-resistance contact. Moreover, by decreasing the diameter of the through-hole 13, a narrow-pitched socket 10 can be realized.

As above stated, the present embodiment is an art which is capable of realizing a socket that provides a great stroke with a small load while maintaining a low-contact resistance, in the case of having convex terminals such as a BGA package.

In addition, the socket 10 of the present embodiment is configured such that the portions of the plated metal circuits 12A and 12B are integrally formed with the molded portion made of a flexible elastomer. Even when the printed circuit board having the socket 10 installed thereon is bent, the elastomer follows the bending of the printed circuit board.

Accordingly, it is also possible to reduce the effect of the bending of the printed circuit board.

Second Embodiment

Figure 3:
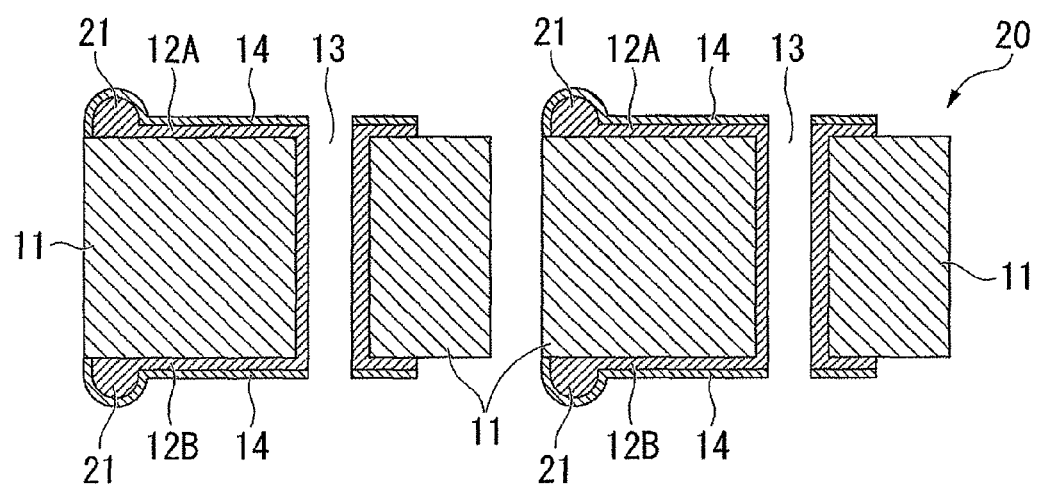
FIG. 3 is a side sectional diagram showing a socket in accordance with a second embodiment of the present invention.

FIG. 3 is a side sectional diagram showing a socket in accordance with a second embodiment of the present invention. A socket 20 of the present embodiment includes substantially the same elements as the socket 10 of the first embodiment, in which the same elements are denoted by the same reference numeral. In the socket 20 of the present embodiment, a dome-shaped convex portion 21 is formed in a portion of the metal circuits 12A and 12B formed on the front and rear surfaces of the elastomeric sheet 11.

The socket 20 of the present embodiment has a socket structure for connection of an LGA package and a printed circuit board. The LGA package is used in the case where the terminals of the IC package have a land configuration, or in the case of the terminals of the printed circuit boards has the land configuration without being soldered in order to replace the contact portions for maintenance as server sockets.

The basic functionality is the same as that of the socket 10 of the first embodiment except that the socket 20 has a structure in which the convex portion 21 is formed in a portion of the formed metal circuits 12A and 12B and the stroke is generated by the height of the convex portion 21.

The socket 20 of the present embodiment can be manufactured by the same manufacturing method as the socket 10 of the first embodiment, except that the convex portion 21 is provided in the present embodiment.

The convex portion 21 can be formed by selectively performing a plating process while masking areas other than the formation area of the convex portion 21. Alternatively, the convex portion 21 may be formed by forming a metal film having a thickness corresponding to the height of the convex portion 21 on the surfaces of the metal circuits 12A and 12B, masking the formation area of the convex portion 21, and selectively etching out unmasked areas. Incidentally, the convex portion 21 may be formed using other methods such as a deposition or a printing method.

Next, a contact operation of the socket 20 in a semiconductor device having the socket of the present embodiment will be described.

Figure 4A:
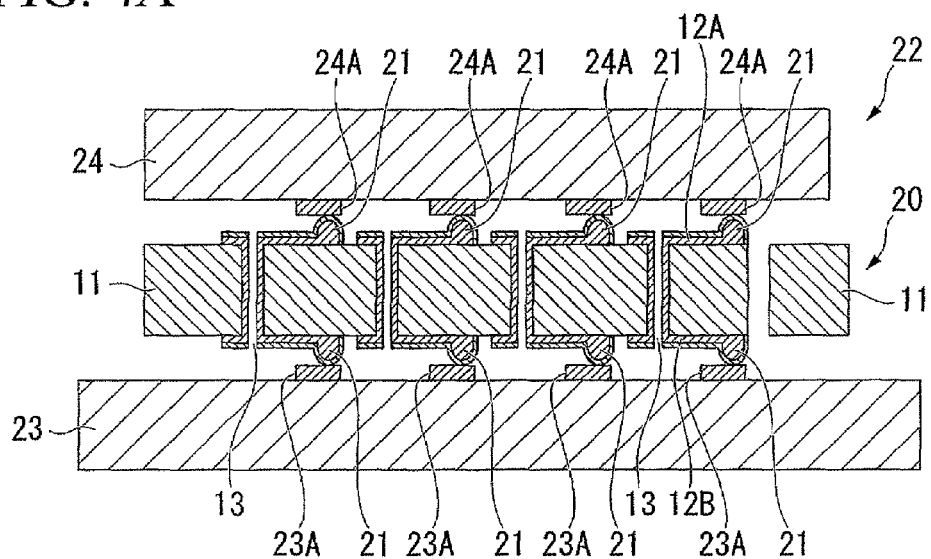
FIG. 4A is a side sectional diagram showing a contact operation of the socket, in which the socket is used as a socket for a LGA package type IC as an example of a semiconductor device having the socket of the second embodiment, and the diagram shows the state of the semiconductor device before the application of compressive force (or the released state after the application of compressive force)
Figure 4B:
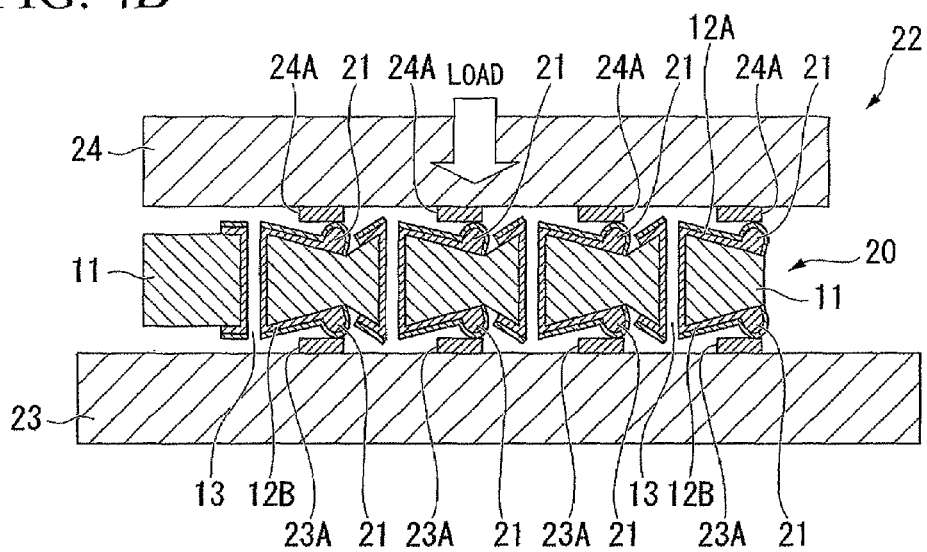
FIG. 4B is a side sectional diagram showing a contact operation of the socket, in which the socket is used as a socket for a LGA package type IC as an example of a semiconductor device having the socket of the first embodiment, and the diagram shows the state of the semiconductor device when compressive force is applied.

FIG. 4 shows a contact operation the socket 20, in which the socket 20 is used as a socket for an LGA package type IC as an example of the semiconductor device having the socket 20 of the present embodiment. FIG. 4A is a side sectional diagram showing the state of the semiconductor device before the application of compressive force (or the released state after the application of compressive force). FIG. 4B is a side sectional diagram showing the state of the semiconductor device. In the drawing, reference numeral 22 represents a semiconductor device, 23 represents a printed circuit board, 23A represents a pattern wire, 24 represents an LGA package (IC package), and 24A represents a land.

FIG. 4A shows the state in which the LGA package 24 is placed on the printed circuit board 23 having the socket 20 installed thereon. The socket 20 has a structure in which the convex portion 21 is formed on the plated metal circuits and the stroke is generated by the height of the convex portion 21.

FIG. 4B shows the state in which a load is applied the structure. When the load is applied thereto, the elastomeric sheet 11 is compressed and falls down while generating a repulsive force. The mechanism of the load and the falling down of the elastomeric sheet at this moment corresponds to the load-displacement characteristic of the socket. In this case, since each of the metal circuits 12A and 12B falls down while being supported on the vicinity of the through-hole 13, the contact point moves toward the through-hole 13 with the application of the load. A wiping function is realized by the movement of the metal circuit 12A. Therefore, an oxide film on the metal contact surfaces can be removed. Accordingly, the connection can be established with the fresh metal surfaces and thus realizing a low-resistance contact. In this case, the elastomeric sheet 11 is designed to have a height or a width enough to realize the required load-stroke characteristic. In particular, it is necessary to design the elastomeric sheet 11 to have a height at least greater than that of the corresponding stroke.

Third Embodiment

Figure 5:
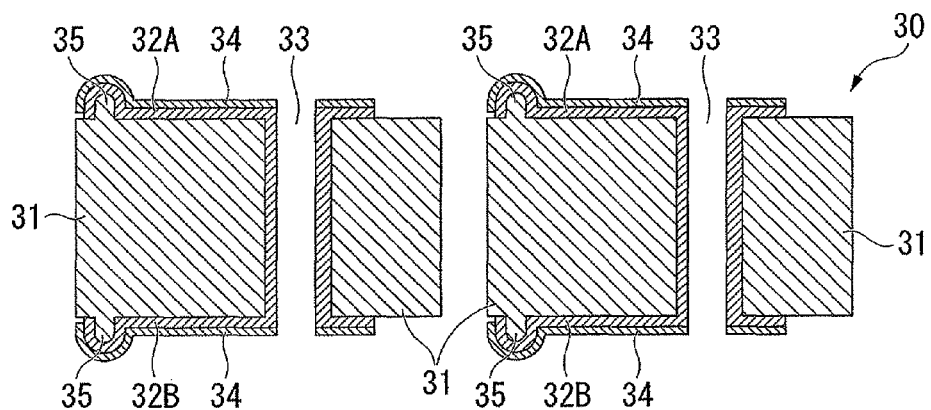
FIG. 5 is a side sectional diagram showing a socket in accordance with a third embodiment of the present invention.

FIG. 5 is a side sectional diagram showing a socket in accordance with a third embodiment of the present invention. A socket 30 of the present embodiment includes an insulating elastomeric sheet 31 having a penetration hole perforated therethrough and a plurality of convex portions 35 formed on the front and rear surfaces thereof, metal circuits 32A and 32B formed on each of the front and rear surfaces of the elastomeric sheet 31, and a through-hole 33 having a metal film formed on the inner wall of the penetration hole. The metal circuit 32A on the front surface of the elastomeric sheet 31 is electrically connected to the metal circuit 32B on the rear surface of the elastomeric sheet 31 via the through-hole 33. A gold plating 34 is formed on each of the metal circuits 32A and 32B. The convex portions 35 formed on the front and rear surfaces of the elastomeric sheet 31 are covered with the metal circuits 32A and 32B which are plated with the gold plating 34.

Similar to the socket 20 of the second embodiment, the socket 30 of the present embodiment has a socket structure for connection of an LGA package and a printed circuit board. The LGA package is used in the case where the terminals of the IC package have a land configuration, or as in the case of server sockets, the terminals of the printed circuit boards has the land configuration without being soldered in order to replace the contact portions for maintenance. The basic functionality is the same as that of the socket 20 of the second embodiment. The socket 30 of the present embodiment has a structure in which the stroke is generated by the height of the convex portion 35.

As a method for providing the convex portions in a portion of the formation area of the metal circuit, such as the present embodiment, a method can be used in which the convex portions 35 are preformed on the elastomeric sheet 31 and a plating process is performed onto the convex portions 35, the formation area of the metal circuit, and the through-hole portion. The convex portions 35 to be formed on the elastomeric sheet 31 can be formed easily by using a mold in which concave portions are formed to correspond to the positions of the convex portions 35 at the time of molding the elastomeric sheet 31.

In this case, it is necessary to form the circuit on the surfaces of the elastomeric sheet including uneven surfaces. Therefore, a process of coating the uneven surfaces with an etching resist may become troublesome.

A spin coating method using a centrifugal force and a surface tension is generally used to form a thick resist film. However, the spin coating method is not applicable to the case of coating an uneven surface with the resist. Therefore, a spray coating method is used in some cases. The spray coating method is a method in which a resist ink having a viscosity suitable for the coating process is made foggy by a spray gun and injected on a substrate so as to form a film on the substrate. Examples of the spray gun used include an airless spray, an air spray, a bell-type spray, and the like, which can coat the uneven surfaces. Incidentally, as a method for exposing the uneven surfaces, an electron beam (EB) exposure method can be used for example in which electron beams are directly exposed onto a coated photoresist (photosensitive resin) so as to form a pattern. Additionally, in the EB exposure method, since the pattern is transferred by irradiating electron beams, the EB exposure method can provide a higher resolution and a greater focal depth than those of the exposure method using light beams as a light source. Therefore, the EB exposure method is particularly suitable for a three-dimensional drawing. Alternatively, other exposure methods other than the EB exposure method may be used so far as they can expose the uneven surfaces in a non-contact manner using a mask without contacting the uneven surfaces. The socket 30 of the present invention is a art which is capable of realizing a socket that provides a great stroke with a small load while maintaining a low-contact resistance, which is suitably usable for the LGA packages or the printed circuit boards having flat land terminals. In this way, since the convex portions are preformed on the elastomeric sheet and a plating process is performed onto the convex portions, the formation area of the metal circuit, and the through-hole portion, it is possible to realize a socket structure suitable for the LGA packaged ICs which can be manufactured in a greatly decreased number of manufacturing steps.

The contact operation of the socket 30 of the present embodiment is the same as that of the socket 20 of the second embodiment shown in FIGS. 4A and 4B.

Fourth Embodiment

Figure 6:
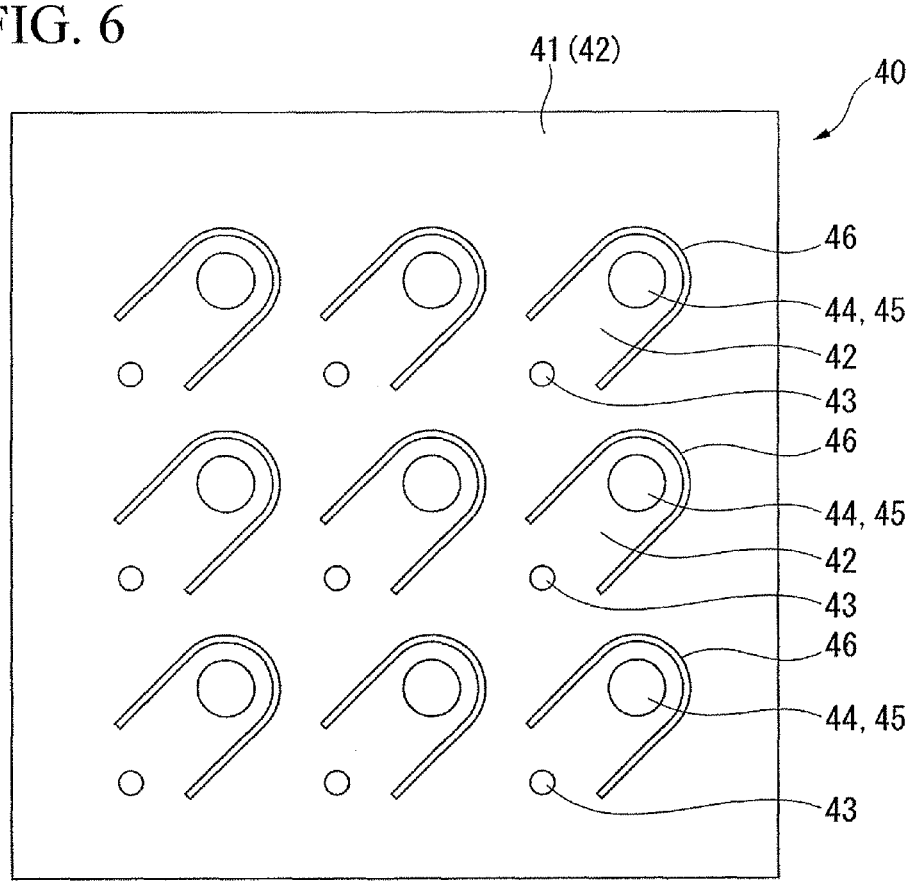
FIG. 6 is a top plan view of a socket in accordance with a fourth embodiment of the present invention.

FIG. 6 is a top plan diagram showing a socket in accordance with a fourth embodiment of the present invention. A socket 40 of the present embodiment includes an insulating elastomeric sheet 41 having a penetration hole perforated therethrough and a U-shaped groove 46 extending along the periphery of a formation area of terminals, a metal circuit 42 formed on each of the front and rear surfaces of the elastomeric sheet 41, and a through-hole 43 having a metal film formed on the inner wall of the penetration hole. The metal circuit 42 on the front surface of the elastomeric sheet 41 is electrically connected to the metal circuit (not shown) on the rear surface of the elastomeric sheet 41 via the through-hole 43. A convex portion 44 being the same as the convex portions of the second and third embodiments is formed in the metal circuit 42. A gold plating 45 is formed on the metal circuit 42 including the convex portion 44.

The socket 40 of the present embodiment has a structure in which the U-shaped groove 46 is formed to extend along the periphery of the formation area of the terminals on at least one of the front and rear surfaces of the elastomeric sheet 41. It is possible to reduce the effect of force transmission between adjacent terminals caused by the compression and decompression of the elastomer in a state where a load is applied thereto. Therefore, even in the case of a structure arranging a number of terminals formed by the metal circuit 42 and the through-hole 43 as shown in FIG. 6, it is possible to realize a secure connection of the entire terminals at the application time of the load. In addition, the load-displacement characteristic of the socket 40 can be controlled by controlling the size of the groove 46. Therefore, it is possible to easily manufacture sockets of various types having different load-displacement characteristics, thereby coping with various and different load-displacement requirements of the sockets. Since electric current flows into the formation areas of the circuits, a low-inductance socket can be realized by decreasing the length of the electrical path. Accordingly, it is possible to realize a socket which is suitable for low-resistance, large-current, and high-speed configurations.

The socket 40 of the present embodiment can be manufactured by the same socket manufacturing method for the first to third embodiments, except that the groove 46 is formed in the present embodiment. After the circuit is formed, the groove 46 may be formed by a laser machining method using a laser of various sources such as a YAG laser, a $CO_2$ laser, an excimer laser, or a femto-second laser, or may be formed using a micro-drill. Alternatively, an elastomer sheet 41 may be molded in which the groove 46 is preformed to reduce the effect of the force transmission between adjacent terminals caused by the compression and decompression of the elastomer.

According to the socket 40 of the present embodiment, by controlling the size of the groove 46 formed on the periphery of the formation areas of the terminals (i.e., by controlling the depth or width of the groove, or the area surrounded by the groove), it is possible to realize a terminal configuration having a desired load-displacement characteristic. Moreover, it is possible to greatly decrease the effect of the load applied to the adjacent terminals.

Incidentally, similar to the sockets of the second and third embodiments, by forming the convex portion 44 on a portion of the metal circuit 42, it is possible to realize a socket structure suitable for the LGA packaged ICs. Meanwhile, the convex portion 44 is not required in the case of having convex terminals such as the BGA packages.

Fifth Embodiment

Figure 7:
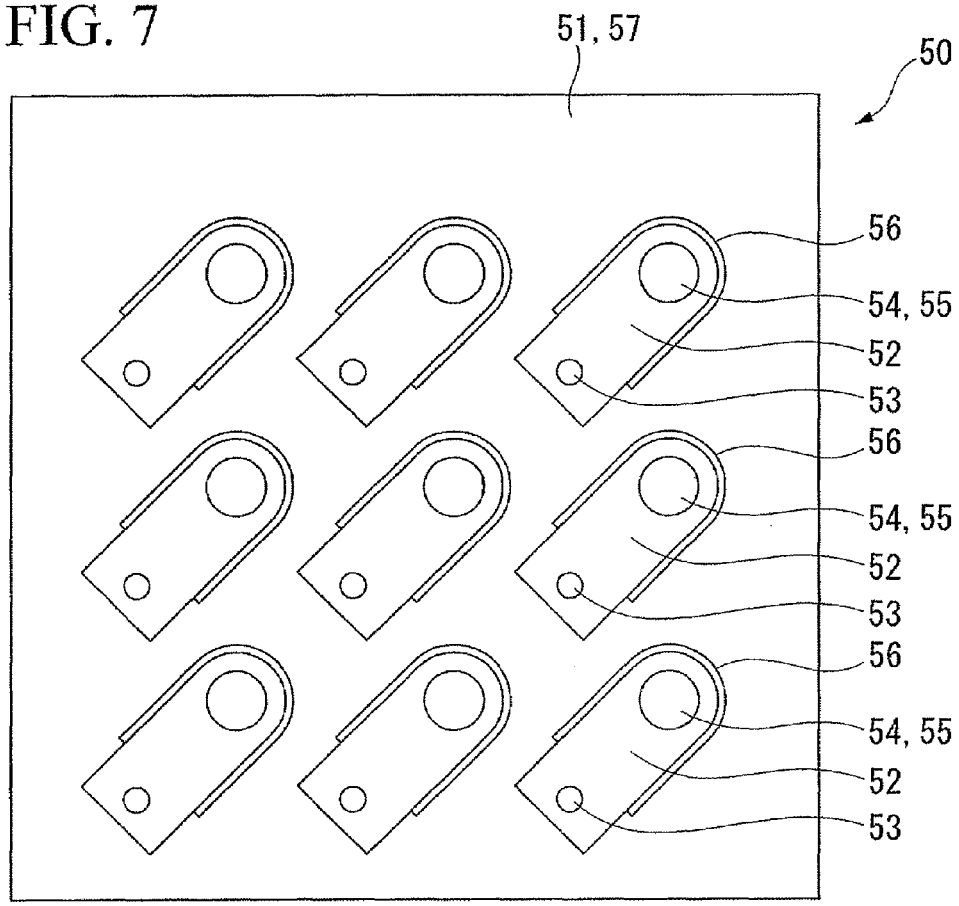
FIG. 7 is a top plan view of a socket in accordance with a fifth embodiment of the present invention.
Figure 8:
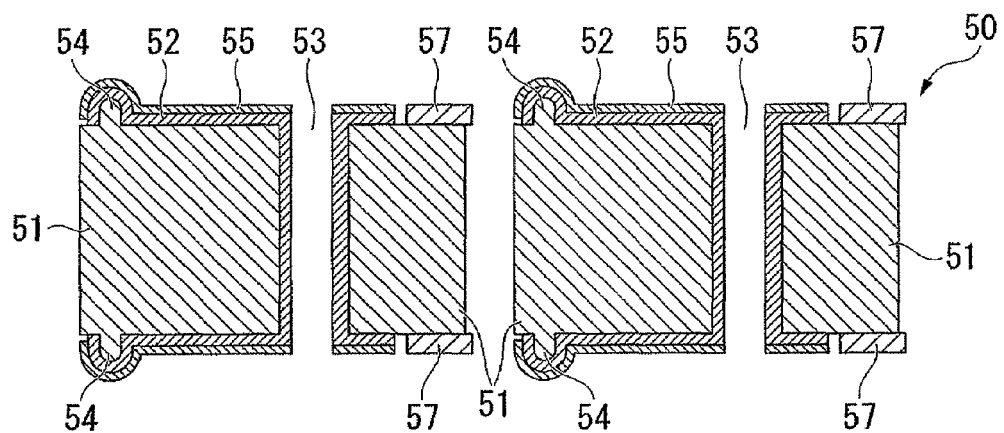
FIG. 8 is a top plan diagram showing the socket in accordance with the fifth embodiment of the present invention.

FIGS. 7 and 8 are diagrams showing a socket in accordance with a fifth embodiment of the present invention. FIG. 7 is a top plan view of a socket 50 of the present embodiment. FIG. 8 is a side sectional diagram showing a main part thereof. A socket 50 of the present embodiment includes an insulating elastomeric sheet 51 having a penetration hole perforated therethrough and a U-shaped groove 56 extending along the periphery of a formation area of terminals, a metal circuit 52 formed within the formation area of the terminals on each of the front and rear surfaces of the elastomeric sheet 51, and a through-hole 53 having a metal film formed on the inner wall of the penetration hole. The metal circuit 52 on the front surface of the elastomeric sheet 51 is electrically connected to the metal circuit on the rear surface of the elastomeric sheet 51 via the through-hole 53. A protective layer 57 made of a material having a thermal expansion coefficient smaller than that of the elastomeric sheet 51 is laminated on at least one of the front and rear surfaces of the elastomeric sheet 51, preferably on portions excluding the formation areas of the terminals on each of the front and rear surfaces and the groove 56 as shown in FIG. 8. A convex portion 54 the same as the convex portions of the second and third embodiments is formed in the metal circuit 52. A gold plating 55 is formed on the metal circuit 52 including the convex portion 54.

The elastomeric sheet used as a base member or an elastic member generally has a large thermal expansion coefficient. When a CPU is mounted on a substrate by means of a socket, the heat generated in the CPU is transmitted to the socket. Therefore, when the elastomeric sheet is used as the base member, it is necessary to design a clearance between terminals in consideration of the expansion and contraction of the elastomer. The socket 50 of the present embodiment is a modified example of the present invention that solves above the problem. The socket 50 of the modified example has a socket structure in which an insulating elastomeric sheet 51 is used as the base member, penetration holes having a small diameter are perforated through the base member, a circuit is formed in a necessary portion on the front and rear surfaces of the elastomeric sheet 51, a metal film is formed on the inner walls of the penetration holes using a plating process or a deposition so as to provide electrical connection between the front and rear surfaces, and the metal films formed on the inner wall of the through-hole 53 makes contact with at least a portion of the metal circuit 52 formed on each of the front and rear surfaces of the elastomeric sheet 51. In such a socket structure, the protective layer 57 made of a material having a thermal expansion coefficient smaller than that of the elastomer is laminated on at least one of the front and rear surfaces of the elastomeric sheet 51 used as the base member. Accordingly, a socket structure is realized in which the effect of the heat generated in the CPU or in the course of the manufacturing processes is reduced.

As a material for the protective layer 57 used in the socket 50 of the present embodiment, a material such as glass fiber, glass epoxy resin or polyimide sheet is preferably usable which has a thermal expansion coefficient smaller than that of the elastomer and close to that of the IC package or the printed circuit board.

With above a structure of the socket 50 of the present embodiment, the thermal expansion of the elastomeric sheet 51 as the base member can be suppressed even when the temperature of the socket 50 is increased due to such as the heat emitted from the CPU. Accordingly, it is possible to design the clearance between the terminals so as to be small and thus to realize a narrow-pitched socket structure.

The socket 50 of the present embodiment can be manufactured by the same socket manufacturing method for the first to fourth embodiments, except that the protective layer 57 is laminated in the present embodiment.

The protective layer 57 can be laminated on the elastomeric sheet 51 by placing a polyimide or a glass epoxy resin having an adhesive attached thereon on the front and rear surfaces of the elastomeric sheet 51 and heating and pressing the polyimide or a glass epoxy resin onto the elastomeric sheet 51 so as to be laminated thereto.

In this case, the operation of pressing the protective layer 57 toward the elastomeric sheet 51 requires careful attention so that a uniform pressing force is applied to the protective layer 57. The pressing operation requires additional attention so that the repulsive force of the elastomeric sheet 51 is lost by any possibly leaking adhesive.

Through the above-described processes, even in the case of the LGA package socket in which the convex portion 54 is formed in the metal circuit 52, it is possible to realize a socket structure suitable for the LGA packaged ICs by heating and using a pressurization jig for exclusive use. Moreover, it is possible to realize a socket structure suitable for the BGA packaged IC in which the convex portion 54 is not formed in the metal circuit 52.

Sixth Embodiment

Figure 9:
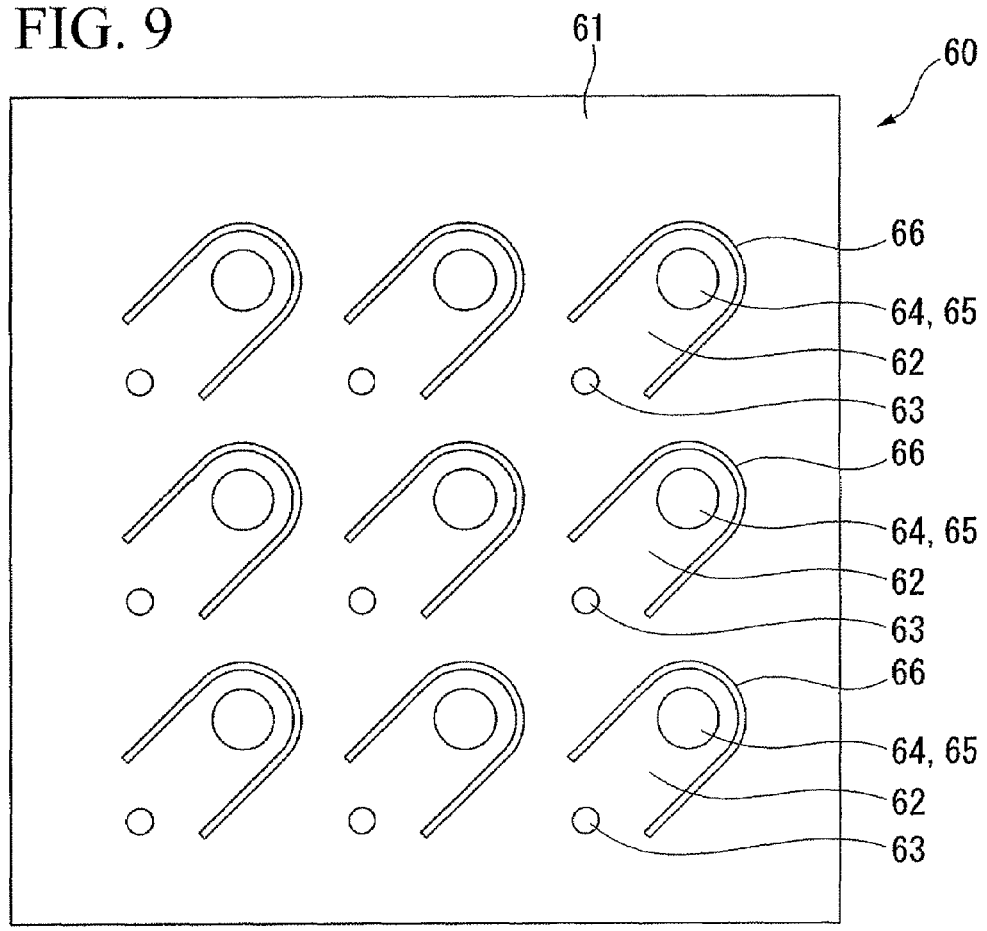
FIG. 9 is a top plan view of a socket in accordance with a sixth embodiment of the present invention.
Figure 10:
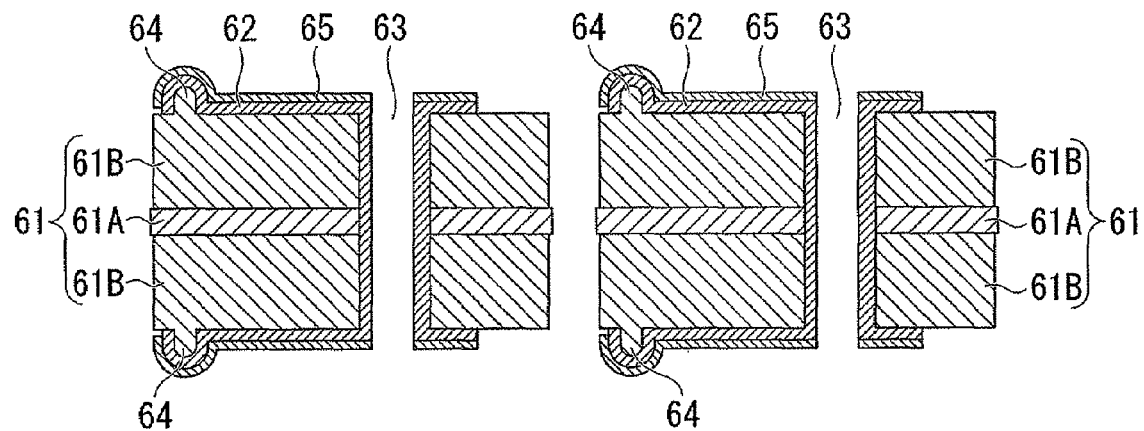
FIG. 10 is a side sectional diagram showing the socket in accordance with the sixth embodiment of the present invention.
Figure 11:
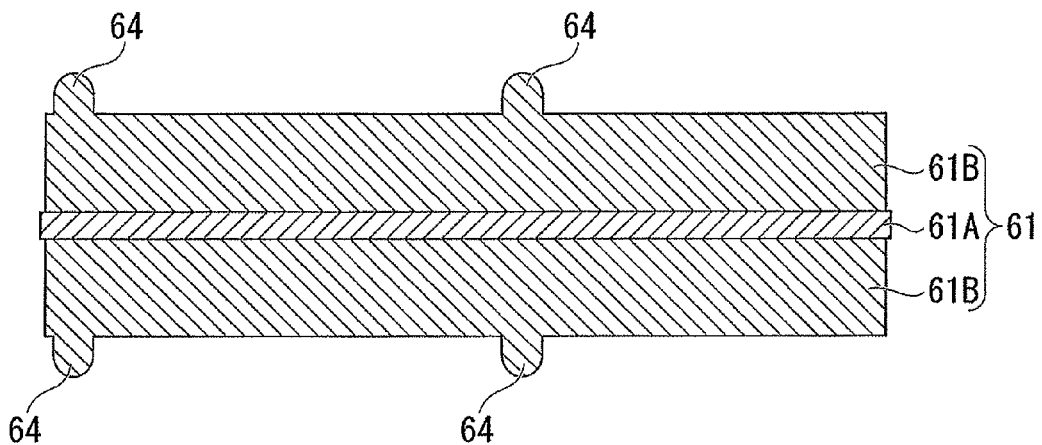
FIG. 11 is a side sectional diagram showing an elastomer sheet used for the manufacturing of the socket of the sixth embodiment.

FIGS. 9 and 10 are diagrams showing a socket in accordance with a sixth embodiment of the present invention. FIG. 9 is a top plan view of a socket 60 of the present embodiment. FIG. 10 is a side sectional diagram showing a main part thereof. A socket 60 of the present embodiment includes an insulating elastomeric sheet 61 made by laminating an elastomeric layer 61B on the front and rear surfaces of a core member 61A made of a material having a thermal expansion coefficient smaller than that of the elastomer, and having a penetration hole perforated therethrough and a U-shaped groove 56 extending along the periphery of a formation area of terminals, a metal circuit 62 formed on the front and rear surfaces of the elastomeric sheet 61, and a through-hole 63 having a metal film formed on the inner wall of the penetration hole. The metal circuit 62 on the front surface of the elastomeric sheet 61 is electrically connected to the metal circuit on the rear surface of the elastomeric sheet 61 via the through-hole 63. A convex portion 64 the same as the convex portions of the second and third embodiments is formed in the metal circuit 62. A gold plating 65 is formed on the metal circuit 62 including the convex portion 64.

The socket 60 of the present embodiment has a socket structure in which the elastomeric sheet 61 is molded in a state that the sheet-like core member 61A made of a material having a thermal expansion coefficient smaller than that of the elastomer is inserted preliminarily into the elastomeric sheet 61 used as a base member. With such a socket structure, the effect of the heat generated in the CPU or in the course of the manufacturing processes can be reduced by the core member 61A. As a material for the core member 61A having a small thermal expansion coefficient, a material such as glass fiber, glass epoxy resin or polyimide sheet is preferably usable which has a thermal expansion coefficient smaller than that of the elastomer and close to that of the IC package or the printed circuit board.

The socket 60 of the present embodiment can be manufactured by the same socket manufacturing method for the first to fourth embodiments, except that the core member 61A is inserted into the elastomeric sheet 61 in the present embodiment.

As a starting member of such a socket structure, a member having a structure shown in FIG. 1 is used. Since the present embodiment relates to a socket structure for the LGA packaged IC, the convex portion 64 is formed in the elastomeric sheet 61. Subsequently, a penetration hole serving as the through-hole is perforated through the elastomeric sheet 61 by means of using a drill or a laser. The subsequent manufacturing processes are the same as those of the socket manufacturing method for the first to fourth embodiments.

With such a structure of the socket 60 of the present embodiment, the thermal expansion of the elastomeric sheet 61 as the base member can be suppressed even when the temperature of the socket 60 is increased due to such as the heat emitted from the CPU. Accordingly, it is possible to design the clearance between the terminals so as to be small and thus to realize a narrow-pitched socket structure.

Since the present embodiment adopts a structure in which the core member 61A having a small thermal expansion coefficient is inserted into the elastomeric sheet 61, the operation of attaching a material having a small thermal expansion coefficient onto the elastomeric sheet 61 does not require such a careful attention to such as maintaining uniform distribution of the pressing force and preventing leaking adhesive that otherwise would be required in the fifth embodiment. Accordingly, it is possible to improve the production yield.

Seventh Embodiment

Figure 12:
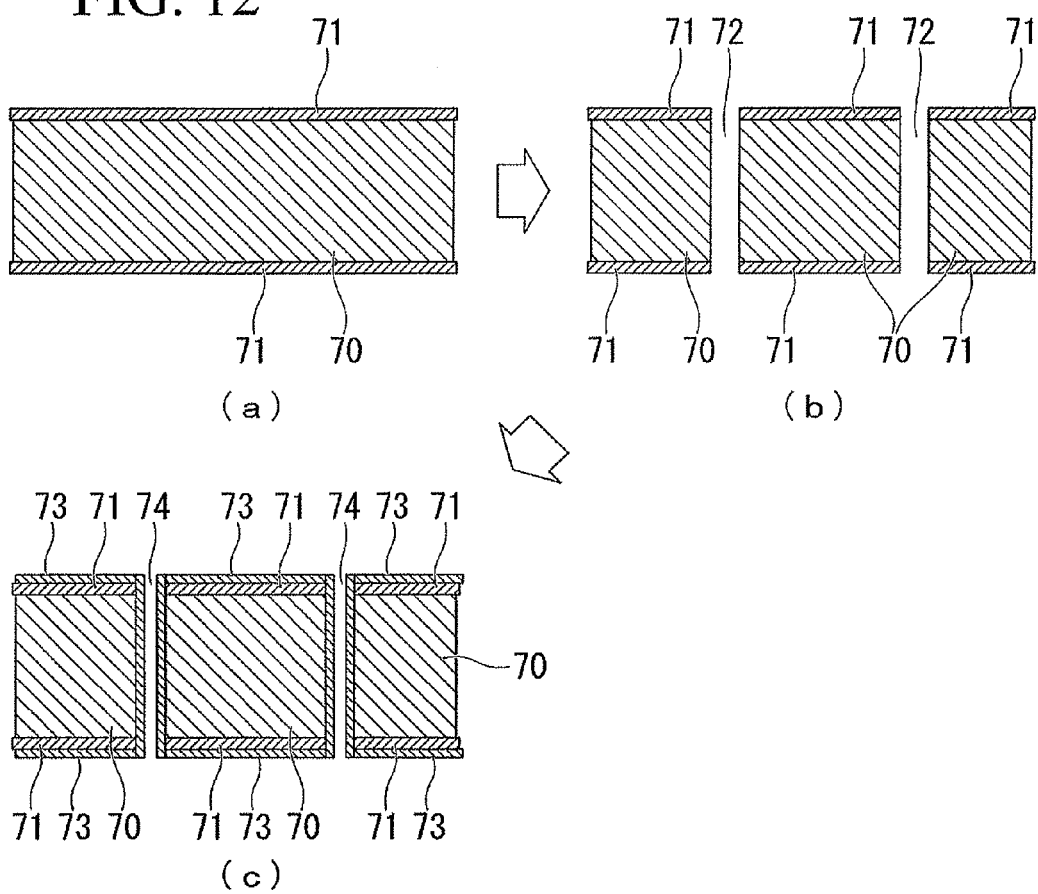
FIG. 12 is a side sectional diagram showing in sequence a part of the manufacturing processes of the socket in accordance with a seventh embodiment of the present invention.

FIG. 12 is a diagram showing a socket in accordance with a seventh embodiment of the present invention. In FIG. 12, Step (a) shows a step of laminating a copper foil 71 on the front and rear surfaces of an elastomeric sheet 70, Step (b) shows a step of perforating a penetration hole 72 serving as a through-hole 74 through the elastomeric sheet 70 having the copper foil 71 laminated thereon, and Step (c) shows a step of forming a metal film 73 on the surface of the copper foil 71 and the inner wall of the penetration hole 72 by means of a plating process and thus forming the through-hole 74.

The present embodiment provides a simple method for manufacturing the socket of the present invention.

In the manufacturing method for the present embodiment, the copper foil 71 having an adhesive attached thereon is first placed on the front and rear surfaces of the insulating elastomeric sheet 70, and the copper foil 71 is then heated and pressed toward the elastomeric sheet 70, whereby the copper foil 71 is laminated on the front and rear surfaces of the elastomeric sheet 70 (see Step (a) in FIG. 12).

Next, the penetration hole 72 serving as the through-hole is perforated through the elastomeric sheet 70 having the copper foil 71 attached thereon by means of a drill machining process or a laser machining process (see Step (b) in FIG. 12).

Next, an electroplating process is performed using the copper foil 71 in order to form the metal film 73 on the surface of the copper foil 71 and the inner wall of the penetration hole 72, thereby forming the through-hole 74 (see Step (c) in FIG. 12).

As a method for forming the metal film 73 on the inner wall of the penetration hole 72 serving as the through-hole 74, a method can be used in which catalytic materials or particles of palladium or carbon are caused to adhere onto the inner wall of the penetration hole 72 so as to form a plate base on the inner wall and the through-hole 74 is formed by the electroplating process. On the metal film 73 formed on each of the front and rear surfaces of the elastomeric sheet 71, there is disposed at least one circuit-formation area electrically connected to an interlayer conduction portion. As a method of adhering particles serving as the plate base of the through-hole 73, a DPP (direct plating process) method may be used. In this case, if it is hard to perform the plating process, a surface energization treatment or a coarse surface treatment using a sandblast or a plasma asher may be performed in order to facilitate the plating process.

Next, the copper foil 71 and the metal film 73 laminated on the front and rear surfaces of the elastomeric sheet 70 are suitably cut so as to form a circuit by means of an etching process or a laser machining process. As a result, a socket structure of the present invention is realized.

By such a socket manufacturing method, it is possible to form a thick plating in a relatively short time compared with the case of forming the through-hole by means of an electroless plating process or a deposition. Accordingly, it is possible to realize a high throughput.

By combining the socket structure and the socket manufacturing method of the present embodiment with those of the sixth embodiment, it is possible to realize a socket having a high productivity while exhibiting a small thermal volume-change.

Eighth Embodiment

Figure 13A:
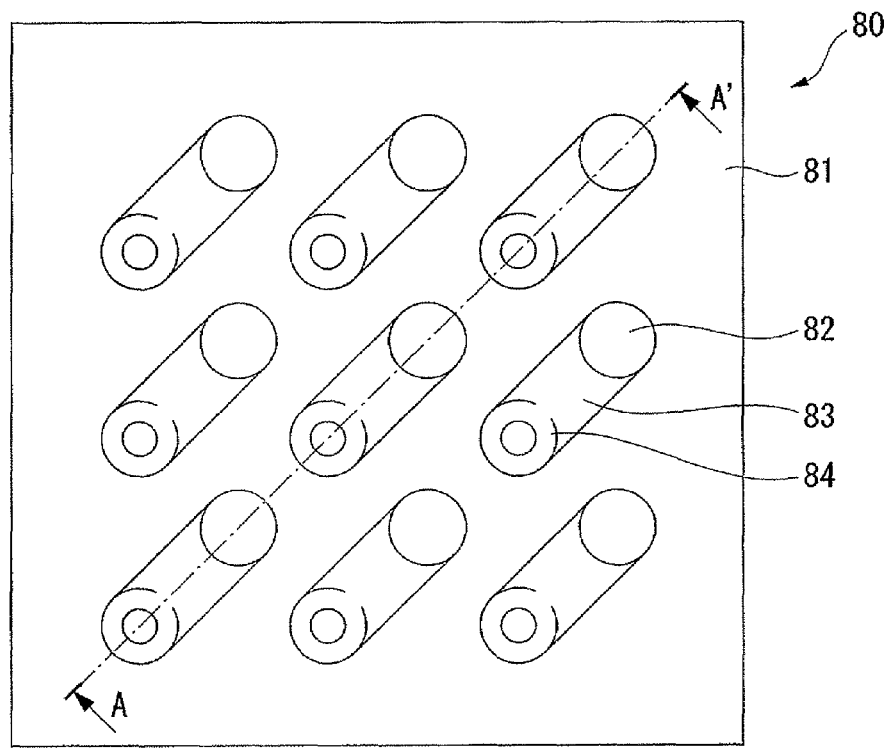
FIG. 13A is a top plan view of a socket in accordance with an eighth embodiment of the present invention.
Figure 13B:
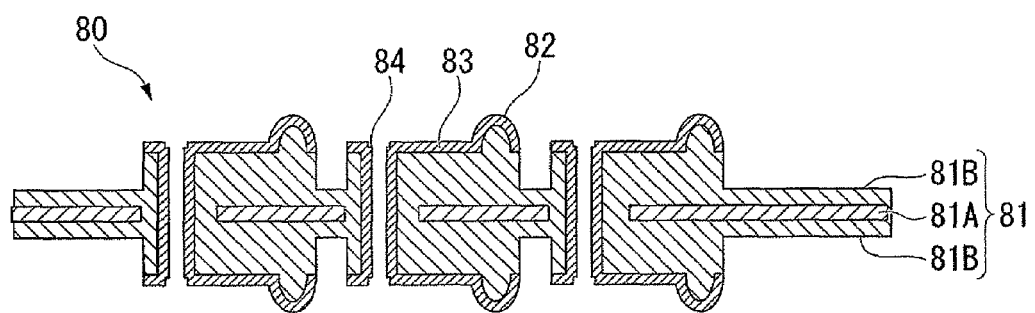
FIG. 13B is a cross-sectional view taken along the line A-A' in FIG. 13A showing a socket in accordance with an eighth embodiment of the present invention.

FIGS. 13A and 13B are diagrams showing a socket in accordance with an eighth embodiment of the present invention. FIG. 13A is a top plan view of a socket 80. FIG. 13B is a cross-sectional view taken along the line A-A' in FIG. 13A. The socket 80 of the present embodiment includes an elastomeric sheet 81 made by laminating an elastomeric layer 81B formed from a fluorinated elastomer on the front and rear surfaces of a core member 81A, a number of terminals 83 formed on the front and rear surfaces of the elastomeric sheet so that a couple of terminals in opposite directions on the front and rear surfaces of the elastomeric sheet might be connected electrically by the through-hole plated portion 84, a domical portion 82 (a convex portion) which has a stiffness and protruded like a dome shape on the side opposite to the through-hole plated portion 84 of the terminal 83 so that the terminal 83 of the elastomeric sheet 81 might be formed high and a part except the terminal 83 might be formed low in comparison, and a concave portion (a groove) formed between the terminals 83.

The terminals 83 are formed of a copper plating or a copper foil and the domical portion 82 is plated by a gold plating. In addition, if necessary, the terminals 83 and the through-hole plated portion 84 are plated by a gold plating. When a load is applied, as shown in FIG. 14B, a portion of the elastomeric sheet 81 contacting with the domical portion 82 is pressed and distorted. The domical portion 82 has a certain amount of stiffness such that itself is not distorted.

Since the socket 80 of the present embodiment has a structure in which the part of terminals 83 of the elastomeric sheet 81 is high, the part except terminal 83 is low and a groove is formed between the terminal parts, when a load is applied, as shown in FIG. 14B, the elastomeric sheet 81 is pressed and distorted being at the part of domical portion 82 and terminal 83 and is capable of being escaped into a groove being between the terminal parts. Accordingly, since a working force on a gap between the neighboring terminal parts is decreased, every terminal 83 is capable of being improved a independent activity and, when a load is applied, connections of all terminals 83 are capable of being assured.

Moreover, when a load is applied, since the elastomer is able to escape into the groove above, a driving is capable of being realized by a light load to the same displacement. Accordingly, a total amount of multi-pinned sockets is able to be lightened.

Figure 14A:
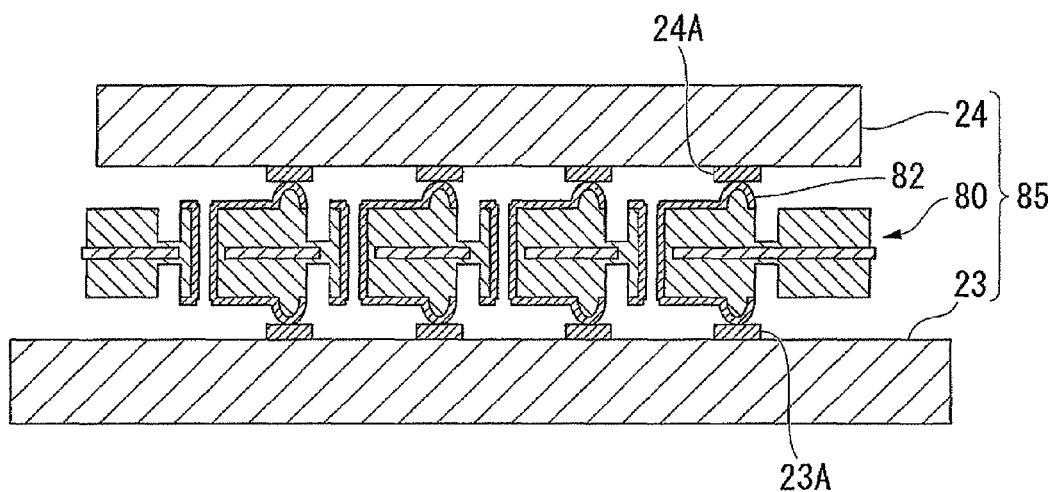
FIG. 14A is a side sectional diagram showing a contact operation of the socket, in which the socket is used as a socket for a LGA package type IC as an example of a semiconductor device having the socket of the eighth embodiment, and the diagram shows the state of the semiconductor device before the application of compressive force (or the released state after the application of compressive force)
Figure 14B:
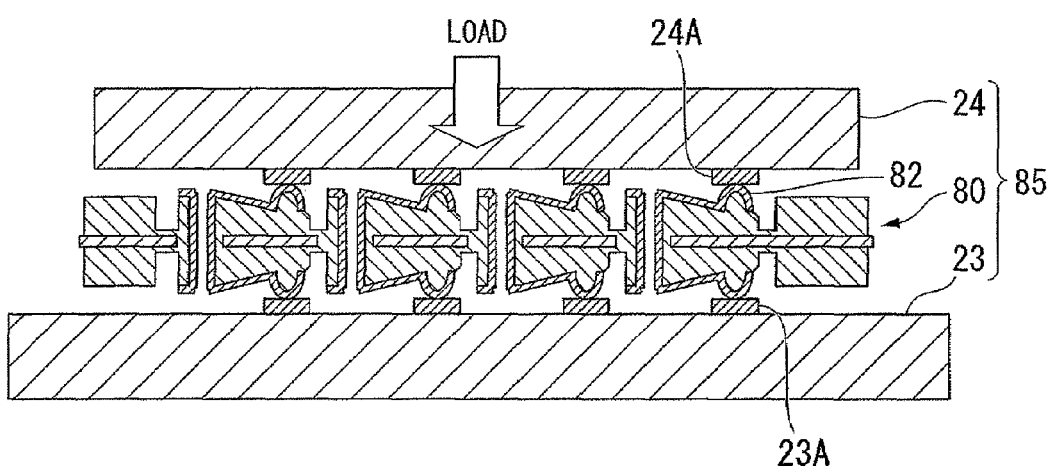
FIG. 14B is a side sectional diagram showing a contact operation of the socket, in which the socket is used as a socket for a LGA package type IC as an example of a semiconductor device having the socket of the eighth embodiment, and the diagram shows the state of the semiconductor device when compressive force is applied.

FIGS. 14A and 14B are diagrams showing a contact operation of the socket, in which the socket 80 is used as a socket for a LGA package type IC as an example of a semiconductor device having the socket 80 of the present embodiment. FIG. 14A is a side sectional diagram showing the state of the semiconductor device 85 before the application of compressive force (or the released state after the application of compressive force); FIG. 14B is a side sectional diagram showing the state of the semiconductor device 85 at the time of application of a load.

The semiconductor device 85 of this example is put between a printed board 23 and a LGA package 24, as shown in FIG. 14A, and set with the domical portion 82 of the socket 80 contacts with a pattern wiring 23A installed on the upper surface of the printed board 23 and a LGA land 24A formed on the lower side LGA package 24.

When a load is applied to the semiconductor device 85 as shown in FIG. 14B, a portion of the elastomeric sheet 81 at the domical portion 82 and the terminal 83 is pressed and distorted. Thereby, the domical portion 82 and the terminal 83 fall down onto the elastomeric sheet 81 while generating a repulsive force, and the mechanism of the load and the falling down of the elastomeric sheet 81 at this moment corresponds to the load-displacement characteristic of the socket 80.

Since every terminal 83 falls down while being supported in the vicinity of the through-hole, the contact point moves toward the through-hole side with the application of the load. Herewith, a wiping effect is realized by the movement of the contacting position on the domical portion 82, and an oxide film on the contacting surfaces of each other's metal can be removed. Accordingly, the connection can be established with the fresh metal surfaces and thus realizing a low-resistance electrical connection.

Figure 15:
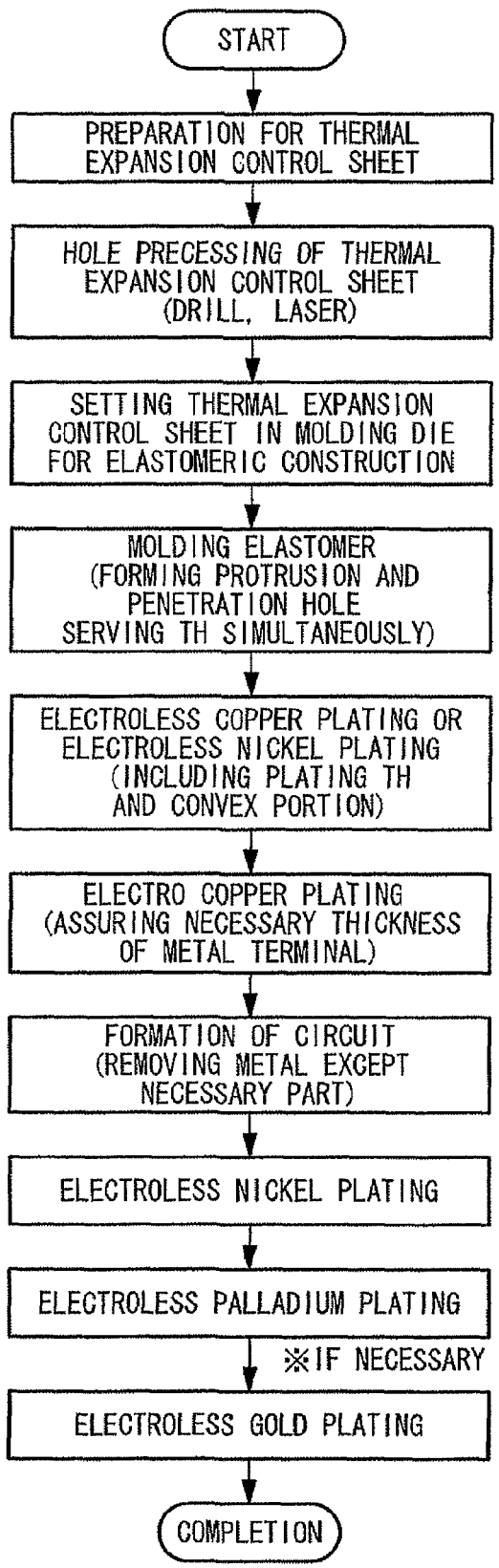
FIG. 15 is a process chart showing a method of manufacturing the socket in accordance with a eighth embodiment of the present invention by way of an example.

FIG. 15 is a process chart showing a method of manufacturing the socket in accordance with the present embodiment by way of an example.

In a method of manufacturing the socket in accordance with the present embodiment, a heat expansion control seat (the core material 81A) is first prepared. Next, a hole processing is performed to the seat (a drill processing and a laser beam processing) in order to form the penetration hole serving as a through hall (TH).

Next, the seat is set in the molding die for the elastomeric construction, the elastomeric layer 81B formed from a fluorine-based elastomer is laminated on both surfaces of the seat in order to form the elastomeric seat 81. When this forming, simultaneously, the terminal 83, a protrusion serving as the domical portion 82, and the penetration hole serving a through hall are formed.

Next, an electroless copper plating or an electroless nickel plating is plated on both the front surface and the rear surface of the formed elastomeric seat in order to form a conductive plating ground layer. By means of the plating treatment, a plated through-hole part and the domical portion are also plated.

Next, an electro copper plating is plated on the ground layer in order to assure a thickness of metal terminal the terminal 83 needs.

Next, the copper plating except a necessary part is removed by etching in order to form the circuit.

Next, an electroless copper plating, an electroless palladium plating (if necessary) and an electroless gold plating are plated on the domical portion 82 and so on in order to manufacture the socket 80 as shown in FIG. 13.

Ninth Embodiment

Figure 16A:
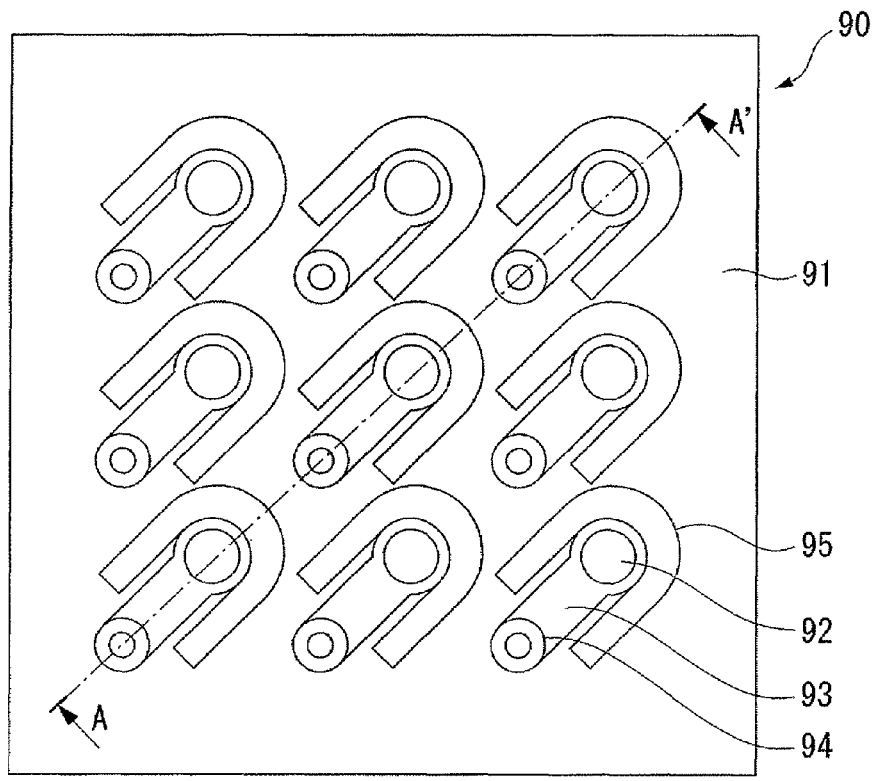
FIG. 16A is a top plan view of a socket in accordance with a ninth embodiment of the present invention.
Figure 16B:
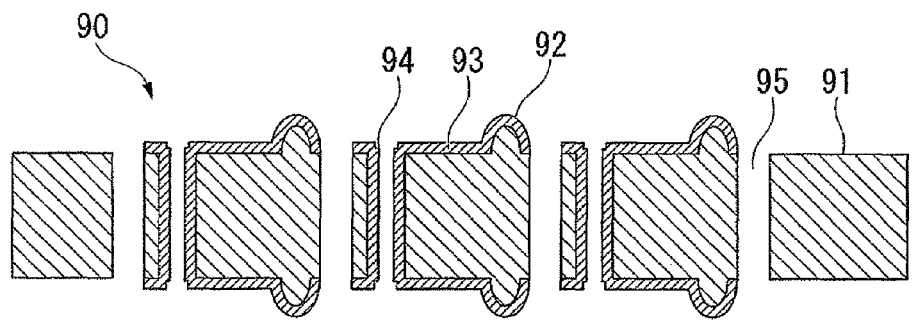
FIG. 16B is a cross-sectional view taken along the line A-A' in FIG. 16A showing a socket in accordance with a ninth embodiment of the present invention.

FIGS. 16A and 16B are diagrams showing a socket in accordance with a ninth embodiment of the present invention. FIG. 16A is a top plan view of a socket 80. FIG. 16B is a cross-sectional view taken along the line A-A' in FIG. 16B.

The socket 90 of the present embodiment includes an elastomeric sheet 91 formed from a fluorinated elastomer on the front and rear surfaces of the elastomeric sheet 91, a number of terminals 93 formed on the front and rear surfaces of the elastomeric sheet so that a couple of terminals 93 in opposite directions on the front and rear surfaces of the elastomeric sheet might be connected electrically by the through-hole plated portion 94, a domical portion 92 (a convex portion) which has a stiffness and protruded like a dome shape on the side opposite to the through-hole plated portion 94 of the terminal 93, and a U-shaped slit 95 served as a U-shaped penetration hole formed at the marginal part of the terminal 93 of the elastomeric sheet 91 except the neighborhood of the through hole plated portion 94.

The terminal 93 is formed by a copper plating or a copper foil and the domical portion 92 is plated by a gold plating. Furthermore, if necessary, a gold plating may be plated on the terminal 93 and a through hole plated portion 94. When a load is applied, as shown in FIG. 17B, by means of pressing and distorting a portion of the elastomeric sheet 91 contacting with the domical portion 92, the domical portion 92 is able to have a certain amount of stiffness such that itself is not distorted.

However the present embodiment provides a structure without a heat expansion control seat (a core material) as the elastomeric sheet 91, a structure with a core material may be applied. In the case of using a core material, a U-shaped slit 95 is not formed as a penetration hole and formed as a structure left only a core material.

The socket 90 of the present embodiment has a U-shaped slit 95 formed at the marginal part of the terminal 93 of the elastomeric sheet 91. Herewith, when a load is applied, as shown in FIG. 17B, the elastomeric sheet 91 is pressed and distorted being at the part of the domical portion 92 and the terminal 93 and is capable of being escaped into a U-shaped slit 95. Accordingly, since a working force on a gap between the neighboring terminal parts is decreased, every terminal part 93 is capable of being improved a independent activity and, when a load is applied, connections of all terminal parts 93 is capable of being assured.

Moreover, when a load is applied, since the elastomer is able to escape into the groove above, a driving is capable of being realized by a light load to the same displacement. Accordingly, a total amount of multi-pinned sockets is able to be lightened.

Figure 17A:
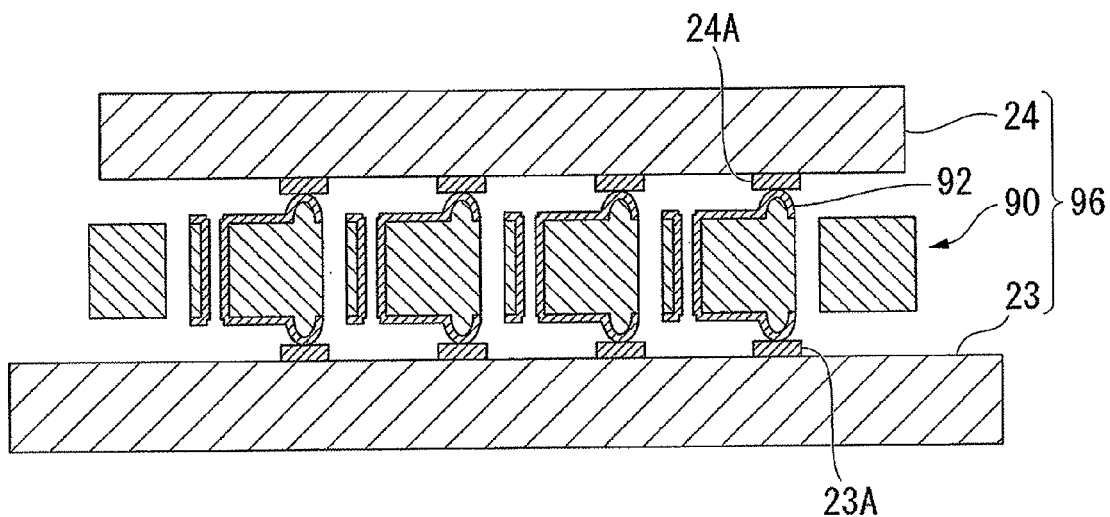
FIG. 17A is a side sectional diagram showing a contact operation of the socket, in which the socket is used as a socket for a LGA package type IC as an example of a semiconductor device having the socket of the ninth embodiment, and the diagram shows the state of the semiconductor device before the application of compressive force (or the released state after the application of compressive force)
Figure 17B:
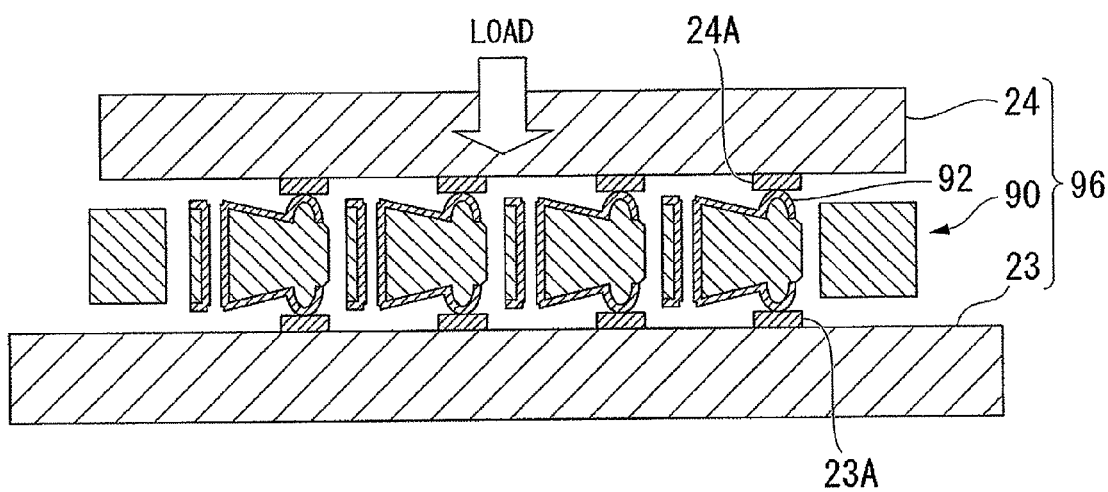
FIG. 17B is a side sectional diagram showing a contact operation of the socket, in which the socket is used as a socket for a LGA package type IC as an example of a semiconductor device having the socket of the ninth embodiment, and the diagram shows the state of the semiconductor device when compressive force is applied.

FIGS. 17A and 17B are diagrams showing a contact operation of the socket, in which the socket 90 is used as a socket for a LGA package type IC as an example of a semiconductor device having the socket 90 of the present embodiment. FIG. 17A is a side sectional diagram showing the state of the semiconductor device 96 before the application of compressive force (or the released state after the application of compressive force); FIG. 17B is a side sectional diagram showing the state of the semiconductor device 96 at the time of application of a load.

The semiconductor device 96 of this example is put between a printed board 23 and a LGA package 24, as shown in FIG. 17A, and set with the domical portion 92 of the socket 80 contacts with a pattern wiring 23A installed on the upper surface of the printed board 23 and a LGA land 24A formed on the lower side LGA package 24.

When a load is applied to the semiconductor device 96 as shown in FIG. 17B, a portion of the elastomeric sheet 91 at the domical portion 92 and the terminal 93 is pressed and distorted. Thereby, the domical portion 92 and the terminal 93 fall down onto the elastomeric sheet 91 while generating a repulsive force, and the mechanism of the load and the falling down of the elastomeric sheet 91 at this moment corresponds to the load-displacement characteristic of the socket 90. Since every terminal 93 falls down while being supported in the vicinity of the through-hole, the contact point moves toward the through-hole side with the application of the load. Herewith, a wiping effect is realized by the movement of the contacting position on the domical portion 92, and an oxide film on the contacting surfaces of each other's metal can be removed. Accordingly, the connection can be established with the fresh metal surfaces and thus realizing a low-resistance electrical connection.

Figure 18:
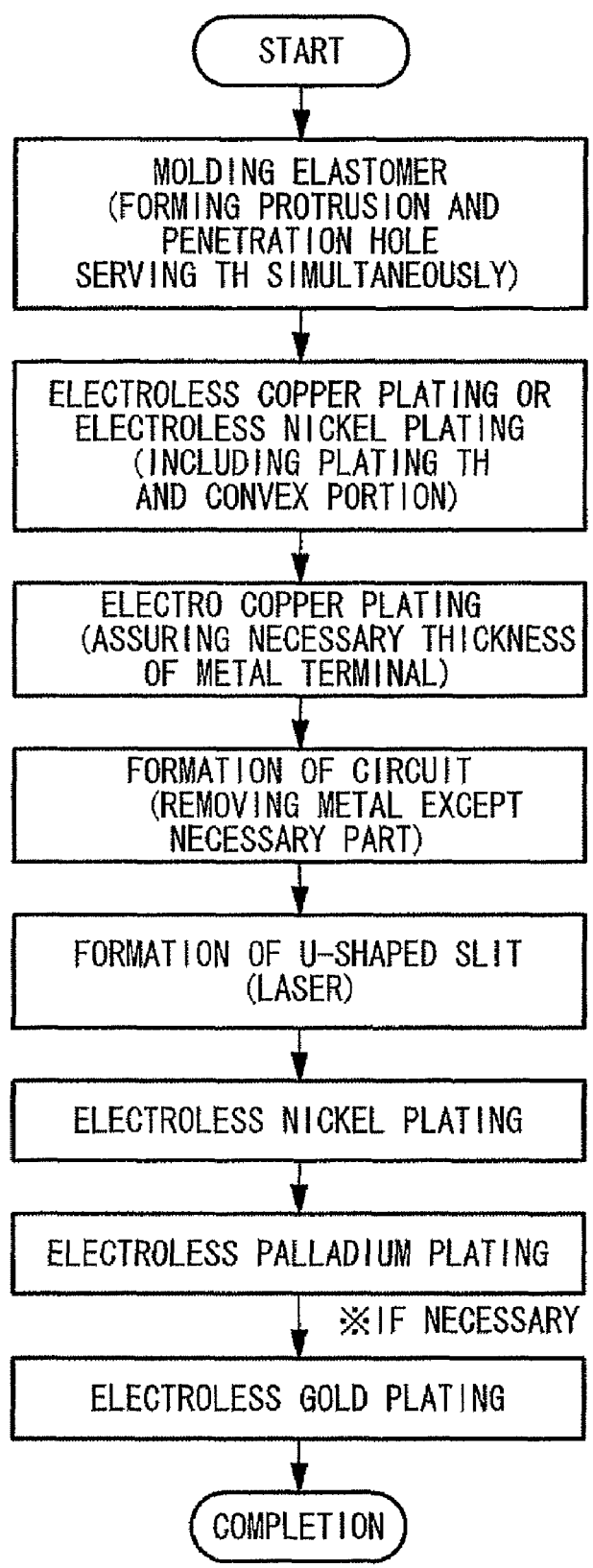
FIG. 18 is a process chart showing a method of manufacturing the socket in accordance with a ninth embodiment of the present invention by way of an example.

FIG. 18 is a process chart showing a method of manufacturing the socket in accordance with the present embodiment by way of an example.

In a method of manufacturing the socket in accordance with the present embodiment, First, the elastomeric seat 91 is formed and shaped from a fluorine-based elastomer in order to form the elastomeric seat 91. When this forming, simultaneously, a projection portion serving as the domical portion 92, and the penetration hole serving a through hall (TH) are formed.

Next, an electroless copper plating or an electroless nickel plating is plated on both the front surface and the rear surface of the formed elastomeric seat in order to form a conductive plating ground layer. By means of the plating treatment, a plated through-hole part and the domical portion are also plated.

Next, an electro copper plating is plated on the ground layer in order to assure a thickness of metal terminal the terminal 93 needs.

Next, the copper plating except a necessary part is removed by etching in order to form the circuit.

Next, a laser machining is performed at the marginal part of every terminal 93 in order to form a U-shaped slit 95.

Next, an electroless copper plating, an electroless palladium plating (if necessary) and an electroless gold plating are plated on the domical portion 92 and so on in order to manufacture the socket 90 as shown in FIGS. 16A and 16B.

INDUSTRIAL APPLICABILITY

In view of the above-described, the present invention is able to provide an excellent socket contact terminal capable of coping with low resistance, large current and fast operation speed requirements and a semiconductor device using the same.

The invention claimed is:

1. A socket comprising:
an insulating elastomeric sheet formed from a fluorine-based elastomer having a penetration hole;
metal circuits formed on the front and rear surfaces of the elastomeric sheet;
a through-hole defined by a metal film formed on an inner wall of the penetration hole, wherein the metal circuit on the front surface of the elastomeric sheet is electrically connected to the metal circuit on the rear surface of the elastomeric sheet via the through-hole; and
a groove is formed in the elastomeric sheet and surrounds at portion of the metal circuits,
wherein the insulating elastomeric sheet comprises a convex portion formed of the fluorine-based elastomer, and wherein the metal circuit formed on one of the front and rear surfaces of the elastomeric sheet is formed to cover the convex portion of the elastomeric sheet, to engage the pad of a printed circuit board, and
wherein a protective layer made of a material having a thermal expansion coefficient smaller than that of the elastomer sheet is laminated on at least one of the front and rear surfaces of the elastomeric sheet.

2. The socket according to claim 1, wherein a plurality of the metal circuits and the respective through-holes may be formed and a plurality of the grooves may be formed in a whole area except parts of the metal circuits.

3. The socket according to claim 1, wherein a convex portion is formed in at least a portion of the metal circuits on the front and rear surfaces of the elastomeric sheet.

4. The socket according to claim 1, wherein the protective layer is either or both of a polyimide sheet and a glass epoxy.

5. A semiconductor device including the socket according to claim 1, and a printed circuit board and an IC package electrically connected to each other via the socket.

6. The semiconductor device according to claim 1, wherein the groove extends along a U-shape about the metal circuit.

7. The semiconductor device according to claim 1, wherein the metal circuits are formed directly on the front and rear surfaces of the elastomeric sheet, and the metal circuits respectively abut the front and rear surfaces of the elastomeric sheet.

8. The socket according to claim 1, wherein the elastomeric sheet is made by laminating elastomeric layers on the front and rear surfaces of a sheet-like core member made of a material having a thermal expansion coefficient smaller than that of the elastomeric layers.

9. The socket according to claim 8, wherein the penetration hole formed in the elastomeric sheet comprises a penetration hole formed in the sheet-like core member axially aligned with through-holes formed in each of the elastomeric layers.

10. The socket according to claim 8, wherein the core member is either or both of a polyimide sheet and a glass epoxy.

11. A method for manufacturing a socket, the method comprising:
preparing an insulating elastomeric sheet formed from a fluorine-based elastomer having a penetration hole; and
forming metal circuits on at least one of the front and rear surfaces of the elastomeric sheet and forming a through-hole by forming a metal film on an inner wall of the penetration hole, thereby obtaining a socket in which the metal circuit on the front surface of the elastomeric sheet is electrically connected to the metal circuit on the rear surface of the elastomeric sheet via the through-hole; and
forming a groove on the elastomeric sheet surrounding at least a portion of the metal circuits,
wherein the elastomeric sheet is formed to comprise a convex portion formed of the fluorine-based elastomer, and wherein the metal circuit on one of the front and rear surfaces of the elastomeric sheet is formed to cover the convex portion, and
wherein a protective layer made of a material having a thermal coefficient smaller than that of the elastomeric sheet is laminated on at least one of the front and rear surfaces of the elastomeric sheet.

12. The method for manufacturing the socket according to claim 11, wherein in the preparing the elastomer sheet, a metal foil serving as the metal circuit is attached onto the elastomeric sheet, and the through-hole is formed by electroplating the metal foil, thereby securing electrical connection between the front and rear surfaces.

13. The method for manufacturing a socket according to claim 11, wherein a plurality of the terminals that includes the metal circuits and the respective through-holes may be formed and a plurality of the grooves are formed in a whole area except parts of the terminals.

14. The method for manufacturing the socket according to claim 11, wherein a convex portion is formed in at least a portion of the metal circuits on the front and rear surfaces of the elastomeric sheet.

15. The method for manufacturing a socket according to claim 11, wherein the protective layer is either or both of a polyimide sheet and a glass epoxy.

16. The method for manufacturing a socket according to claim 11, wherein the groove is formed along a U-shape about the metal circuit.

17. The method for manufacturing a socket according to claim 11, wherein the metal circuits are formed directly on the front and rear surfaces of the elastomeric sheet, and the metal circuits respectively abut the front and rear surfaces of the elastomeric sheet.

18. The method for manufacturing a socket according to claim 11, wherein the elastomeric sheet is made by laminating elastomeric layers on the front and rear surfaces of a sheet-like core member made of a material having a thermal expansion coefficient smaller than that of the elastomeric layers.

19. The method for manufacturing a socket according to claim 18, wherein the penetration hole formed in the elastomeric sheet comprises a through-hole formed in the sheet-like core member axially aligned with through-holes formed in the elastomeric layers.

20. The method for manufacturing a socket according to claim 18, wherein the core member is either or both of a polyimide sheet and a glass epoxy.

* * * * *